(12) United States Patent
Kaneshiro et al.

(10) Patent No.: US 9,441,082 B2
(45) Date of Patent: Sep. 13, 2016

(54) POLYIMIDE FILM AND PROCESS FOR PRODUCING THE SAME

(71) Applicants: Hisayasu Kaneshiro, Kyoto (JP); Toshihisa Itoh, Shiga (JP); Kiyokazu Akahori, Shiga (JP)

(72) Inventors: Hisayasu Kaneshiro, Kyoto (JP); Toshihisa Itoh, Shiga (JP); Kiyokazu Akahori, Shiga (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 14/583,009

(22) Filed: Dec. 24, 2014

(65) Prior Publication Data

US 2015/0119534 A1 Apr. 30, 2015

Related U.S. Application Data

(60) Division of application No. 11/674,620, filed on Feb. 13, 2007, now Pat. No. 8,962,790, which is a continuation of application No. 10/468,524, filed as application No. PCT/JP02/01727 on Feb. 26, 2002, now abandoned.

(30) Foreign Application Priority Data

| Feb. 27, 2001 | (JP) | 2001-052235 |
|---|---|---|
| Mar. 23, 2001 | (JP) | 2001-086452 |
| Mar. 30, 2001 | (JP) | 2001-099369 |
| May 31, 2001 | (JP) | 2001-165791 |
| Jun. 7, 2001 | (JP) | 2001-172893 |
| Nov. 30, 2001 | (JP) | 2001-367440 |
| Feb. 15, 2002 | (JP) | 2002-038287 |

(51) Int. Cl.
| C08G 69/26 | (2006.01) |
| C08J 5/18 | (2006.01) |
| B29C 41/28 | (2006.01) |
| B29D 7/01 | (2006.01) |
| B29C 41/00 | (2006.01) |
| B29C 41/24 | (2006.01) |
| B29C 41/46 | (2006.01) |
| C09D 179/08 | (2006.01) |
| B29K 79/00 | (2006.01) |
| B29K 105/00 | (2006.01) |
| B29L 7/00 | (2006.01) |

(52) U.S. Cl.
CPC ............. *C08J 5/18* (2013.01); *B29C 41/003* (2013.01); *B29C 41/24* (2013.01); *B29C 41/28* (2013.01); *B29C 41/46* (2013.01); *B29D 7/01* (2013.01); *C09D 179/08* (2013.01); *B29K 2079/08* (2013.01); *B29K 2105/0005* (2013.01); *B29K 2105/0014* (2013.01); *B29L 2007/008* (2013.01); *C08J 2379/08* (2013.01); *H05K 2201/0154* (2013.01); *Y10T 428/31721* (2015.04)

(58) Field of Classification Search
CPC ..... C08J 2379/08; C08J 5/18; C09D 179/08; H05K 2201/0154; Y10T 428/31721; C09J 2479/08
See application file for complete search history.

(56) References Cited

U.S. PATENT DOCUMENTS

| 3,179,630 | A | * | 4/1965 | Endrey ............ C08G 73/1007 521/185 |
|---|---|---|---|---|
| 3,410,826 | A | | 11/1968 | Endrey |
| 4,474,662 | A | | 10/1984 | Makino et al. |
| 4,788,098 | A | | 11/1988 | Sado et al. |
| 4,886,874 | A | | 12/1989 | Nagano et al. |
| 5,070,181 | A | | 12/1991 | Kawai et al. |
| 5,081,229 | A | | 1/1992 | Akahori et al. |
| 5,128,444 | A | | 7/1992 | Inoue et al. |
| 5,231,162 | A | | 7/1993 | Nagata |
| 5,260,413 | A | | 11/1993 | Ochsner et al. |
| 5,324,475 | A | | 6/1994 | Okahashi |
| 5,667,851 | A | | 9/1997 | Edman et al. |
| 5,686,559 | A | | 11/1997 | Rhee |
| 5,830,564 | A | | 11/1998 | Kohno et al. |

(Continued)

FOREIGN PATENT DOCUMENTS

| EP | 0418889 A2 | 3/1991 |
| EP | 0984030 A2 | 3/2000 |

(Continued)

OTHER PUBLICATIONS

Office Action dated Nov. 27, 2015, issued in co-pending U.S. Appl. No. 14/582,989. (24 pages).

(Continued)

*Primary Examiner* — Gregory Listvoyb
(74) *Attorney, Agent, or Firm* — Westerman, Hattori, Daniels & Adrian, LLP

(57) ABSTRACT

A process includes the steps of: casting or coating a polyamic acid organic solvent solution on a support and drying the polyamic acid organic solvent solution thereon, so as to form a partially cured and/or partially dried polyamic acid film; dipping the polyamic acid film in tertiary amine or a solution of tertiary amine, or coating tertiary amine or a solution of tertiary amine on the polyamic acid film; and drying the film while imidizing the polyamic acid. In another process, a chemical converting agent and a catalyst are mixed in an organic solvent solution of polyamic acid. After casting and heating the mixture on a support, a partially cured and/or partially dried polyamic acid film is detached from the support. The film contains, with respect to the remaining volatile component, not less than 50 parts of catalyst, not more than 30 parts of solvent, and not more than 20 parts of chemical converting agent and/or a chemical converting agent derived component. The remaining amic acid is imidized and the film is dried.

6 Claims, 5 Drawing Sheets

(56) References Cited

U.S. PATENT DOCUMENTS

| | | |
|---|---|---|
| 6,133,408 A | 10/2000 | Chiu et al. |
| 6,207,739 B1 | 3/2001 | Ono et al. |
| 6,350,844 B1 * | 2/2002 | Ono ................. B32B 15/08 428/411.1 |
| 6,399,669 B1 | 6/2002 | Suzuki et al. |
| 6,586,081 B1 | 7/2003 | Nishinaka et al. |
| 6,746,639 B2 | 6/2004 | Yabuta et al. |
| 6,797,801 B2 | 9/2004 | Sadanobu et al. |

FOREIGN PATENT DOCUMENTS

| | | | |
|---|---|---|---|
| JP | 57-109614 A | | 7/1982 |
| JP | 60-190313 A | | 9/1985 |
| JP | 60-190314 A | | 9/1985 |
| JP | 61-111359 A | | 5/1986 |
| JP | 62-236827 A | | 10/1987 |
| JP | 63-221138 A | | 9/1988 |
| JP | 64-013242 A | | 1/1989 |
| JP | 64-020238 A | | 1/1989 |
| JP | 01-131241 A | | 5/1989 |
| JP | 06-009801 A | | 1/1994 |
| JP | 08-081571 A | | 3/1996 |
| JP | 08-100072 A | | 4/1996 |
| JP | 08-157597 A | | 6/1996 |
| JP | 08230063 A | | 9/1996 |
| JP | 09-227697 A | | 9/1997 |
| JP | 10-264185 A | | 10/1998 |
| JP | 10-323854 A | | 12/1998 |
| JP | 11-000930 A | | 1/1999 |
| JP | 11-071474 A | | 3/1999 |
| JP | 11-198157 A | | 7/1999 |
| JP | 2000-191806 A | | 7/2000 |
| JP | 2000-204178 A | | 7/2000 |
| JP | 2001-072781 | * | 3/2001 |
| JP | 2001-072781 A | | 3/2001 |
| JP | 2002-172637 A | | 6/2002 |
| JP | 05-237928 B2 | | 7/2013 |

OTHER PUBLICATIONS

Final Office Action dated Apr. 19, 2016, issued in U.S. Appl. No. 14/582,989, (15 pages).

* cited by examiner

POLYIMIDE FILM AND PROCESS FOR PRODUCING THE SAME

CROSS-REFERENCE TO THE RELATED APPLICATIONS

This is a divisional of application Ser. No. 11/674,620 filed Feb. 13, 2007, which is a continuation of application of Ser. No. 10/468,524 filed Aug. 18, 2003, which is a national phase of international application No. PCT/JP2002/01727 filed Feb. 26, 2002, the entire contents of which are incorporated by reference. This application also claims benefit of priority under U.S.C. §119 to Japanese Patent Application No. 2001-052235 filed Feb. 27, 2001, Japanese Patent Application No. 2001-086452 filed Mar. 23, 2001, Japanese Patent Application No. 2001-099369 filed Mar. 30, 2001, Japanese Patent Application No. 2001-165791 filed May 31, 2001, Japanese Patent Application No. 2001-172893 filed Jun. 7, 2001, Japanese Patent Application No. 2001-367440 filed Nov. 30, 2001 and Japanese Patent Application No. 2002-038287 filed Feb. 15, 2002, the entire contents of all of which are incorporated by reference.

TECHNICAL FIELD

The present invention relates to high-quality polyimide films and producing processes for suitably producing such polyimide films.

The invention also relates to producing processes for producing highly strong polyimide films with good productivity.

The invention also relates to polyimide films with mechanical strengths and with small unevenness of mechanical properties in a transverse direction, and producing processes of such polyimide films.

The invention also relates to polyimide films with superior in-plane isotropy and with improved dimensional stability, and producing processes of such polyimide films.

The invention also relates to polyimide films with high modulus and with low coefficient of thermal expansion, and producing processes of such polyimide films.

BACKGROUND ART

Polyimide films are heat resistant, insulative, solvent resistant, and low-temperature resistant, and it is for this reason that polyimide films have been widely used as a material of electronic and electrical components of computers and IC controls, for example, such as flexible printed circuit boards, base films of TAB carrier tapes, electronic cable coverings for air craft and the like, base films of magnetic recording tapes, and wire rod coverings for superconductive coils. Various types of polyimide films are suitably selected depending on their use.

Therefore, there has been increasing demand for polyimide films and there is a present need to develop a producing process for producing polyimide films with higher productivity.

It has also become common over the last years to use polyimide films in small general devices such as portable phones. The smaller and thinner electronic and electrical components have caused the wiring of the circuits to fine. This change in dimension of parts used in these components may cause the circuit structure of fine wiring to malfunction by wire breakage or shorting, etc. Therefore, those parts used in such electronic and electrical components are required to have highly accurate dimensional stability.

Incidentally, a common producing process of a polyimide film involves casting or coating an organic solvent solution of polyamic acid, which is the precursor, onto a support, followed by solidification and heat treatment. The polyimide film produced in this manner and its producing process had the following problems.

In the foregoing producing process, the process employs either thermal curing or chemical curing. In the case of thermal curing, a solvent is removed from the polyamic acid varnish, which is the polyimide precursor, to form a polyamic acid film, and the polyamic acid film is then converted to a polyimide film by heating. However, in this process, when heating time is reduced, the film fails to show sufficient levels of properties or the film may crack. In chemical curing, a polyamic acid varnish is mixed with a chemical imidizing agent to obtain a gel film, which is cured and dried to obtain the product polyimide film. However, when the polyamic acid film (gel film) which is partially cured and/or partially dried is to be prepared in a shorter period of time to improve productivity, the chemical imidization of the gel film becomes insufficient and as a result basic mechanical strengths of the product polyimide film, such as tear propagation strength, tensile strength, and adhesion strength suffer.

Common procedures of producing the polyimide film proceed as follows. As shown in FIG. 4, a polyamic acid solution composition, which is the polyimide precursor, is mixed with a chemical imidizing agent in an extruder 102. The mixture is spread in a direction of width by the extruder 102 and continuously extruded through a narrow slit opening of a slit die 104 onto an endless belt, on which the mixture forms a flat thin film. The film is imidized while it is dried and cooled to solidify to the extent where the film becomes self-supporting. The film is then subjected to a heat treatment.

Where the polyamic acid composition as the polyimide precursor is used to form the polyimide film by casting using a T die, which involves casting, heating, and drying of the film for the completion of imidization, a sudden onset of the imidization reaction in the process of casting may cause a resin film to partially undergo imidization. This might cause gel defects on the film or the problem of coating stripe which is caused by clogging of the slit die by a partially imidized gel product. While these problems can be effectively solved by controlling the imidization reaction by cooling the polyamic acid solution composition to 0° C. or below, it tends to increase the viscosity, in particular, of the polyamic acid solution composition.

With such a viscosity range, i.e., with the use of a resin solution composition with such a relatively high viscosity, the resin solution composition becomes resilient. In this case, as shown in FIG. 5, a curtain 122 of the fluidic resin solution composition extruded from the slit die 120 is pulled in the machine direction as the speed of the belt becomes faster. Pulling of the curtain 122 in the machine direction makes the landing sheet angle θ between the curtain 122 and the belt 124 of a reel smaller, which may cause the curtain 122 to trap surrounding air when it lands on a surface of the belt 124.

As a result, air is sealed between a surface of the resin film 126 and the belt 124 to leave large and small bubbles of protrusions on the surface of the resin film 126. This air trapping phenomenon has a detrimental effect on the surface of the resin film in the drying step of the resin film, as it causes the resin film to thin or breaks and fluctuates the resin film by expansion of the trapped air.

Further, the high viscosity curtain, because it is more elastic than the curtain of a lower viscosity and has stronger adhesion for the belt, is pulled in the machine direction by the movement of the belt. The curtain pulled by the belt to move over a certain distance in the machine direction is opposed by the force of the opposite direction exerted by the elasticity of the resin film. This opposing force periodically changes the landing site of the curtain, which in turn changes the thickness of the product resin film, with the result that the thickness periodically becomes uneven in the machine direction. Such an uneven thickness appears as a striped pattern on the product film.

As a counter-measure to this problem, Japanese Publication for Unexamined Patent Application No. 198157/1999 (Tokukaihei 11-198157; published on Jul. 27, 1999) discloses a film producing method by casting, in which the viscosity in a die is lowered to prevent air trapping during casting of the resin film and to improve uneven thickness. A lower viscosity in the die is attained by lowering a degree of polymerization of the resin solution composition or by increasing the solvent proportion of the resin solution composition.

However, the mechanical properties of the polyimide film obtained by the method of lowering the degree of polymerization as disclosed in the foregoing publication 11-198157 are significantly poorer than those of the polyimide film obtained from equimolar amounts of diamine component and tetracarboxylic dianhydride component. Further, in the method in which a solvent proportion of the resin solution composition is increased as disclosed in the foregoing publication 11-198157, the temperature of the belt needs to be increased by a large margin to dry the film on the endless belt until the film becomes self-supporting. As a result, the product polyimide film has poor mechanical properties.

As described, in the film producing method by casting as disclosed in the foregoing publication 11-198157 in which air trapping during casting of the resin film is prevented to improve evenness of the film, the mechanical properties of the product polyimide film are considerably poor. Such poor mechanical properties prevent stable production of flexible printed circuit boards, base films of TAB carrier tapes, electronic cable coverings of air craft and the like, base films of magnetic recording tapes, and wire rod coverings for super conductive coils and the like, because the film stretches to generate a slack during their production. The products, as a result, have poor mechanical resistance and poor reliability.

In the foregoing step of solidifying the film before the heat treatment until the film becomes self-supporting, the heat treatment often involves grasping end portions of the film using clips or pins (known as a tenter frame method).

However, in this case, curing of the film cannot be carried out evenly in the transverse direction, and particularly the end portions cannot be cured sufficiently. This is because a grasping jig such as clips or pins prevents a temperature increase at the end portions of the film, or high temperatures of the heat treatment in a heating furnace become uneven when the width of the product polyimide film is wide. Attempts to compensate for the insufficiently cured end portions have resulted in over curing of the central portion, which degrades properties.

The tenter frame method, while it is a suitable conventional technique to maintain or stretch the width of the gel film against cure shrinkage of the gel film in the drying and curing step of the heat treatment in the heating furnace, the held end portions and the unheld central portion often shrink differently. Thus, for the last many years, a solution has been sought for a phenomenon in which the molecular chains of polyimide are oriented in an oblique direction by a 45° angle particularly at the end portions. This anisotropy of molecular orientation is closely associated with properties which relate to dimensional stability, and therefore causes a direction-dependent difference of properties. Such a molecular orientation therefore fails to meet the demand for a material of a flexible printed circuit board and the like of ever increasing precision.

Methods for obtaining isotropic films are disclosed in Japanese Publication for Unexamined Patent Application Nos. 190314/1985 (Tokukaisho 60-190314; published on Sep. 27, 1985), 237928/1993 (Tokukaihei 5-237928; published on Sep. 17, 1993), and 81571/1996 (Tokukaihei 8-81571; published Mar. 26, 1996).

Commonly, a mother roll of the product film is suitably provided with a slit of a predetermined width. It has also become common to produce a wide film so that more products could be made from a single mother roll to increase yield.

Dimensional stability is one property that is required for electronic and electrical components. It is well-known that tensile modulus, which is one of the important parameters of dimensional stability, can be improved with use of monomers having a rigid structure, namely, diamines with high linearity such as paraphenylenediamine, for the diamine component. For example, Japanese Publication for Unexamined Patent Application No. 13242/1989 (Tokukaisho 64-13242; published on Jan. 18, 1989) discloses a three-component polyimide of pyromellitic anhydride, 4,4'-diaminodiphenylether, and paraphenylenediamine. However, a large amount use of rigid and highly linear monomers causes too low coefficient of thermal expansion to be applicable to the laminates with a metal foil like a copper foil. Further, generally, the use of rigid and highly monomers lowers flexibility of the film to cause a problem in bendability which is one of the advantages of the flexible printed circuit board. Further, in order to improve tensile modulus, Japanese Publication for Unexamined Patent Application No. 111359/1986 (Tokukaisho 61-111359; published on May 29, 1986) discloses a four-component polyimide which contains 3,3'-4,4'-biphenyltetracarboxylic dianhydride. However, this technique poses the problem of productivity because it increases the number of monomer components and complicates the polymerization step of polyamic acid, which is the precursor of polyimide. Further, since the technique uses a special type of monomer, it is disadvantageous in terms of cost. Further, Japanese Publication for Unexamined Patent Application No. 20238/1989 (Tokukaisho 64-20238; published on Jan. 24, 1989) discloses improving properties by stretching. However, this technique introduces a complex stretching device in the production process and has a problem that, depending on the type of polyimide, the film may be broken during the stretching process.

DISCLOSURE OF INVENTION

In order to achieve the foregoing objects, a process for producing a polyimide film according to the present invention includes the steps of: casting or coating and subsequently drying an organic solvent solution of polyamic acid on a support, so as to produce a partially cured and/or partially dried polyamic acid film; dipping the polyamic acid film in tertiary amine or in a solution of tertiary amine, or applying tertiary amine or a solution of tertiary amine onto the polyamic acid film; and drying the film while imidizing the polyamic acid to polyimide.

A polyimide film according to the present invention may be produced by any of the foregoing processes.

Further, in order to achieve the foregoing objects, another process for producing a polyimide film includes the steps of: mixing a chemical converting agent and a catalyst in a polyamic acid organic solvent solution and casting the resulting polyamic acid composition on a support; heating the polyamic acid composition on the support at temperatures of at least two levels; detaching the polyamic acid film from the support so as to obtain a partially cured and/or partially dried polyamic acid film; and imidizing remaining amic acid in the polyamic acid film and drying the film.

A polyimide film according to the present invention may be produced by the foregoing process.

Further, in order to achieve the foregoing objects, another process for producing a polyimide film according to the present invention includes the steps of: mixing a chemical converting agent and a catalyst in a polyamic acid organic solvent solution and casting and heating the mixture on a support; detaching the resin film from the support with a remaining volatile component, so as to obtain a partially cured and/or partially dried polyamic acid film in which not less than 50 parts by weight is the catalyst, not more than 30 parts by weight is the solvent, and not more than 20 parts by weight is the chemical converting agent and/or a component derived from the chemical converting agent, with respect to 100 parts by weight of the remaining volatile component; and imidizing remaining amic acid and drying the film.

A polyimide film according to the present invention may be produced by the foregoing process.

Further, in order to achieve the foregoing objects, a process for producing a polyimide film according to the present invention, which produces the polyimide film by casting and/or coating a polyamic acid containing composition, includes the step of adding, to an organic solvent solution of the polyamic acid, a curing agent that contains a 1:0.15 to 1:0.75 mole ratio of not less than 1 mole equivalent of a dehydrating agent with respect to the amic acid and not less than 0.2 mole equivalent of an imidizing catalyst with respect to the amic acid.

The producing process of a polyimide film according to the present invention produces the polyimide film that is produced by the foregoing process.

Further, in order to achieve the foregoing objects, in a polyimide film according to the present invention, a width during production is 1 m or greater, a ratio of maximum value to minimum value of tear propagation strength measured across the entire width is 0.7 or greater, and an R value of measured tear propagation strength of not more than 0.6 g.

Further, the inventors of the present invention achieved producing the polyimide film with superior in-plane isotoropy by (I) preventing the shrinkage of the gel film on the support in the process of casting the mixture of polyamic acid, dehydrating agent, ring-closure catalyst, and organic solvents onto a rotating support, and partially heating and/or partially drying the cast mixture to a self-supporting film, (II) using the mixture of dehydrating agent and the ring-closure catalyst in a specific proportion to prevent the shrinkage of the gel film by suitable adhesion between the gel film and the support, (III) heating the gel film under specific temperature condition in the process of removing the gel film with a controlled amount of volatiles from the support and carrying the gel film, whose ends are restrained in the transverse direction, to the heating furnace.

The present invention also provides a novel polyimide film and novel producing processes of the following configurations to achieve the foregoing objects.

1) A polyimide film having a film width of 1250 mm or greater, a degree of molecular orientation MOR-c of not more than 1.30 at any point of the film, and a tensile modulus of not less than 2.5 GPa and not more than 5.0 GPa.

2) A process for producing a polyimide film, which includes the steps of: casting a mixture solution of polyamic acid, dehydrating agent, ring-closure catalyst, and organic solvent on a support so as to obtain a film ("gel film" hereinafter) that is partially cured and/or partially dried to be self-supporting; and passing the gel film through a heating furnace with both ends of the gel film fastened, wherein (1) the polyamic acid mixture solution is mixed with 1.0 to 5.0 equivalent of a dehydrating agent with respect to an amic acid unit and 0.2 to 2.0 equivalent of a ring-closure catalyst with respect to the amic acid unit, and (2) an initial temperature of heating in the heating furnace is controlled to be no more than +100° C. of a temperature of the support and within 150° C. to 250° C.

3) A process of producing a polyimide film as defined in 2), wherein the gel film contains the remaining volatile component in a range of 15% to 150%.

4) A process of producing a polyimide film as defined in 2) or 3), wherein the polyamic acid is obtained by polycondensation of monomers which contain a diamine component and an acid dianhydride, and the diamine component contains not less than 20 mole % of paraphenylenediamine with respect to the total diamine component.

Further, in order to achieve the foregoing objects, a process for producing a polyimide film according to the present invention provides controlled modulus and coefficient of thermal expansion of the polyimide film (1) by partially curing and/or partially drying the polyamic acid until the content of volatile component takes a specific value, and (2) by starting heating under specific temperature conditions in the subsequent heat treatment in the producing process of the self-supporting gel film which is prepared by partially curing and/or partially drying the precursor.

Further, in order to achieve the foregoing objects, a process for producing a polyimide film according to the present invention includes the steps of: casting a mixture solution of polyamic acid, dehydrating agent, ring-closure catalyst, and organic solvent on a support so as to obtain a film ("gel film" hereinafter) that is partially cured and/or partially dried to be self-supporting; and heating the gel film by tenter frame in which a heat treatment is carried out on the gel film with restrained both ends, wherein a content of remaining volatile component of the gel film and an initial temperature of heating in the tenter frame are controlled to control modulus and coefficient of thermal expansion.

Further, a process for producing a polyimide film according to the present invention includes the steps of: casting a mixture solution of polyamic acid, dehydrating agent, ring-closure catalyst, and organic solvent on a support so as to obtain a film ("gel film" hereinafter) that is partially cured and/or partially dried to be self-supporting; and heating the gel film by tenter frame in which heat treatment is carried out on the gel film with restrained both ends, wherein a content of remaining volatile component of the gel film and an initial temperature of heating in the tenter frame are controlled to increase modulus within a range of 1.0 GPa or to lower coefficient of thermal expansion within a range of 4 ppm.

A polyimide film according to the present invention is produced by the foregoing producing process of the polyimide film to have a birefringence of not less than 0.15.

For a fuller understanding of other objects and the nature and advantages of the invention, reference should be made to the ensuing detailed description taken in conjunction with the accompanying drawings.

BEST MODE FOR CARRYING OUT THE INVENTION

Figure 1:
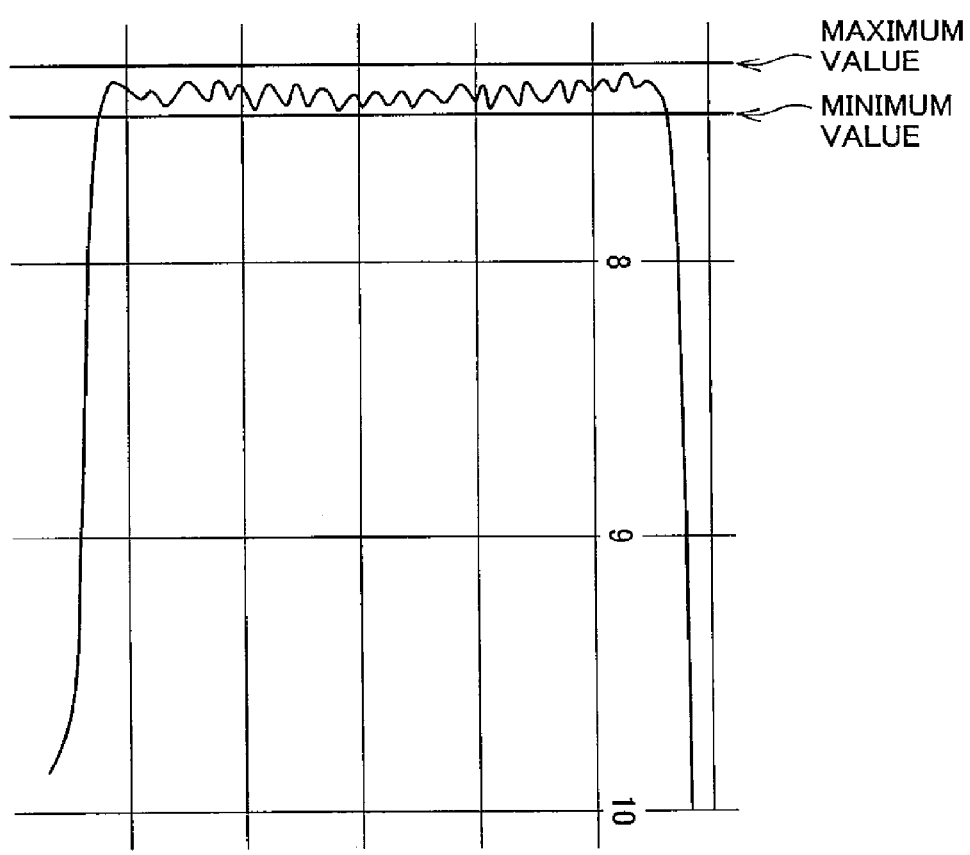
FIG. 1 is a drawing showing how tear propagation strength R is obtained.

Producing processes of polyimide films of the present invention are in principle applicable to the production of any polyimide films.

Note that, "parts" means percent by weight.

The polyamic acid, as used in the present invention, is the precursor of polyimide, and, in principle, any known polyamic acid can be used. The polyamic acid of the present invention can be polymerized by any known methods. Particularly, the following polymerization methods are preferable.

(1) A method in which aromatic diamine is dissolved in an organic polar solvent and reacted therein with essentially an equimolar amount of aromatic tetracarboxylic dianhydride for polymerization.

(2) A method in which aromatic tetracarboxylic dianhydride is reacted in excess mole with an aromatic diamine compound in an organic polar solvent so as to obtain a pre-polymer having acid anhydride groups at the both ends. Subsequent polymerization is carried out using the aromatic diamine compound such that the aromatic tetracarboxylic dianhydride becomes essentially equimolar with the aromatic diamine compound in all steps of production.

(3) A method in which aromatic tetracarboxylic dianhydride is reacted with excess mole of an aromatic diamine compound in an organic polar solvent so as to obtain a pre-polymer having amino groups at the both ends. Subsequent polymerization is carried out by adding an aromatic diamine compound in the pre-polymer and using the aromatic tetracarboxylic dianhydride so that the aromatic tetracarboxylic dianhydride becomes essentially equimolar with the aromatic diamine compound.

(4) A method in which aromatic tetracarboxylic dianhydride is dissolved and/or dispersed in an organic polar solvent and is polymerized using an aromatic diamine compound of an equimolar amount.

(5) A method in which polymerization is carried out by a reaction of a mixture of equimolar amounts of aromatic tetracarboxylic acid dianhydride and an aromatic diamine compound in an organic polar solvent.

The following describes materials used to produce the precursor of polyimide, i.e., the polyamic acid of the present invention.

Examples of acid anhydrides used to produce the polyamic acid include: pyromellitic dianhydride; 2,3,6,7-naphthalene tetracarboxylic dianhydride; 3,3',4,4'-biphenyl tetracarboxylic dianhydride; 1,2,5,6-naphthalene tetracarboxylic dianhydride; 2,2',3,3'-biphenyl tetracarboxylic dianhydride; 3,3',4,4'-benzophenone tetracarboxylic dianhydride; 2,2-bis(3,4-dicarboxyphenyl)propane dianhydride; 3,4,9,10-perylene tetracarboxylic dianhydride; bis(3,4-dicarboxyphenyl)propane dianhydride; 1,1-bis(2,3-dicarboxypheyl)ethane dianhydride; 1,1-bis(3,4-dicarboxyphenyl)ethane dianhydride; bis(2, 3-dicarboxyphenyl)methane dianhydride; bis(3,4-dicarboxyphenyl)ethane dianhydride; oxydiphthalic dianhydride; bis(3,4-dicarboxyphenyl)sulfone dianhydride; p-phenylenebis(trimellitic acid monoester anhydride; ethylene bis(trimellitic acid monoester anhydride; bisphenol A bis(trimellitic acid monoester anhydride; and their analogues. These compounds can be suitably used either individually or in a mixture of any proportions.

Among these compounds, the acid dianhydrides that are most suitable for the precursor of polyimide, i.e., the polyamic acid of the present invention are pyromellitic dianhydride; 3,3',4,4'-benzophenone tetracarboxylic dianhydride; 3,3',4,4'-biphenyl tetracarboxylic dianhydride; p-phenylene bis(trimellitic monoester anhydride. These compounds can be suitably used either individually or in a mixture of any proportions.

Examples of diamines that can be suitably used to produce the precursor of polyimide, i.e., the polyamic acid of the present invention, include: 4,4'-diaminophenylpropane; 4,4'-diaminophenylmethane; benzidine; 3,3'-dichlorobenzidine; 4,4'-diaminodiphenyl sulfide; 3,3'-diaminodiphenylsulfone; 4,4'-diaminodiphenylsulfone; 4,4'-diaminodiphenylether; 3,3'-diaminodiphenylether; 3,4'-diaminodiphenylether; 1, 5-diaminonaphthalene; 4,4'-diaminodiphenyldiethylsilane; 4,4'-diaminodiphenylsilane; 4,4'-diaminodiphenyl ethylphosphine oxide; 4,4'-diaminodiphenyl N-methylamine; 4,4'-diaminodiphenyl N-phenylamine; 1,4-diaminobenzene(p-phenylenediamine); 1,3-diaminobenzene; 1,2-diaminobenzene, and their analogues. These compounds can be suitably used either individually or in a mixture of any proportions.

Among these diamines, 4,4'-diaminodiphenylether and p-phenylenediamine are particularly preferable. Further, these compounds can be suitably used in a mixture with a mole ratio of 100:0 to 0:100, or more preferably 100:0 to 10:90.

The solvents that can be suitably used for the synthesis of the polyamic acid are amide-family solvents, examples of which include N, N-dimethylformamide; N, N-dimethylacetoamide; and N-methyl-2-pyrrolidone. Among these compounds, it is preferable to use N, N-dimethylformamide and N, N-dimethylacetoamide either individually or in a mixture of any proportions.

A polyamic acid solution is usually obtained in a concentration of 5 wt % to 35 wt %, or more preferably 10 wt % to 30 wt %. With a concentration of polyamic acid solution in these ranges, a suitable molecular weight and a suitable solution viscosity can be obtained.

The polyimide is obtained by imidizing its precursor polyamic acid, which is carried out either by thermal curing or chemical curing. The thermal curing is a method in which the imidization reaction proceeds only by heating, without any action of a dehydrating agent or an imidizing catalyst, etc. The chemical curing is a method in which an organic solvent solution of polyamic acid is acted upon by a dehydrating agent as represented by acid anhydrides such as acetic acid anhydride, and by an imidizing catalyst as represented by tertiary amines such as isoquinoline, β-picoline, and pyridine. The chemical curing may be performed with the thermal curing. Reaction conditions of imidization vary depending on the type of polyamic acid, the thickness of the film, or the selected method of curing, which may be thermal curing and/or chemical curing.

Where imidization is carried out by chemical curing, examples of dehydrating agents that are added to the polyamic acid solution in the production of the polyimide film according to the present invention include: aliphatic acid anhydrides; aromatic acid anhydrides; N,N'-dialkylcarbodiimide; lower aliphatic halides; halogenated lower aliphatic halides; haloganated lower aliphatic anhydrides; arylphosphoric acid dihalides; thionyl halides; and a mixture of two or more of these compounds. Among these compounds, aliphatic anhydrides such as acetic acid anhydride, propionic anhydride, lactic anhydride, and the like, or a mixture of two or more of these compounds can be suitably used.

For effective imidization, it is preferable that the dehydrating agent be used simultaneously with the imidizing catalyst. The imidizing catalyst may be aliphatic tertiary amines, aromatic tertiary amines, or heterocyclic tertiary amines, among which compounds selected from heterocyclic tertiary amines are particularly preferable. Specifically, quinoline, isoquinoline, β-picoline, pyridine, and the like can preferably be used.

In a producing process of the polyimide film of the present invention, a step of producing a partially cured and/or partially dried polyamic acid film (gel film) is carried out by a known method. Namely, the organic solvent solution of polyamic acid adjusted in the foregoing manner is cast or coated on a support such as a glass plate, an endless stainless-steel belt, or a stainless-steel drum, so as to carry out imidization by heating. Alternatively, the dehydrating agent and the catalyst are mixed in a polyamic acid solution at a low temperature and the polyamic acid solution is cast in the form of a film on a support and heated to activate the dehydrating agent and the imidizing catalyst. By this thermal imidization or chemical imidization, a partially cured self-supporting polyamic acid film (gel film) is produced. Note that, as the term is used herein, "partially cured" or "partially dried" means partial imidization of the amide bonds initially present in the polyamic acid solution, or partial evaporation or drying of a volatile component initially present in the initial polyamic acid solution. These terms do not mean partial curing or partial drying with respect to the entire surface of the film.

The gel film is in an intermediate stage of curing from the polyamic acid to the polyimide and is self-supporting. A state of the gel film can be expressed by the remaining content of the volatile component and the percentage of imidization, which are calculated as follows.

The remaining content of the volatile component is calculated from $$(A-B) \times 100/B \quad (1)$$

where A is the mass of the gel film, and B is the mass of the gel film after it was heated at 450° for 20 minutes.

The percentage of imidization is calculated by IR absorption spectrometry from $$(C/D) \times 100/(E/F) \quad (2)$$

where C is the height of the absorption peak of the gel film at 1370 cm$^{-1}$, D is the height of the absorption peak of the gel film at 1500 cm$^{-1}$, E is the height of the absorption peak of the polyimide film at 1370 cm$^{-1}$, and F is the height of the absorption peak of the polyimide film at 1500 cm$^{-1}$.

Thereafter, the both ends in the transverse direction of the gel film are grasped using pins or clips, etc., before the gel film is carried to a heating furnace, where the gel film is dried to remove a volatile component such as an organic solvent and then subjected to a heat treatment to obtain the polyimide film.

The following describes one example of the producing process of the polyimide film according to the present invention.

As the term is used herein, "curtain" refers to a particular shape of the fluidic resin solution composition that was extruded from the slit die in the form of a curtain, which exists in the air gap before it lands on the belt.

A producing process of the polyimide film according to the present invention is adapted to form the film by casting of a resin solution composition which is prepared by adding to an organic solvent of polyamic acid a curing agent that contains a 1:0.15 to 1:0.75 mole ratio of not less than 1 mole equivalent of a dehydrating agent with respect to the amic acid and not less than 0.2 mole equivalent of an imidizing catalyst with respect to the amic acid. With this process, it is possible to obtain the polyimide film without decrease of mechanical properties, without air trapping during the casting of the resin film, and with improved thickness uniformity.

The gel film is prepared that is formed by mixing the polyamic acid varnish and the curing agent of the foregoing process and then continuously extruding the mixture in the form of a thin flat curtain from the slit die so as to cast it on the endless belt. The gel film is dried thereon and cooled to be self-supporting and further heated to obtain the polyimide film with desired mechanical properties.

The amount of dehydrating agent used is 1 mole to 5 mole equivalent, preferably 1.2 mole to 4 mole equivalent, or more preferably 1.5 mole to 3 mole equivalent with respect to the amic acid. Outside these ranges, the percentage of imidization may fall below its suitable range, or it may be hard to peel the gel film from the support.

The amount of catalyst used is 0.2 mole equivalent to 1.5 mole equivalent, preferably 0.25 mole equivalent to 1.2 mole equivalent, or more preferably 0.3 mole equivalent to 1 mole equivalent with respect to the amic acid. Outside these ranges, percent imidization may fall below its suitable range, or it may be hard to peel the gel film from the support.

It is preferable that the dehydrating agent and the imidizing catalyst be used in an amount in their foregoing preferable ranges and at a mole ratio of 1:0.15 to 1:0.75, or preferably 1:0.2 to 1:0.7. An amount of imidizing catalyst below 0.15 mole with respect to 1 mole of dehydrating agent prevents the chemical imidization from being carried out sufficiently, which may result in weaker strengths or difficulty in peeling from the support. On the other hand, an amount of imidizing catalyst above 0.75 mole with respect to 1 mole of dehydrating catalyst often increases the rate of curing, which may cause partial imidization of the resin film to cause gel defects on the film, or may cause coating stripes to occur when the slit die is clogged by the partially imidized gel.

The curing agent should be added to 100 parts of the polyamic acid solution in an amount of 30 parts to 80 parts, preferably 35 parts to 75 parts, or more preferably 35 parts to 70 parts. When the amount of curing agent added is less than 30 parts, the viscosity of the resin solution composition containing the curing agent may be high, which often causes air trapping and aggravates thickness unevenness. On the other hand, when the amount of curing agent exceeds 80 parts, drying takes more time, which means lower productivity, and the amount of solvent used is increased, which means higher cost.

The viscosity of the resin solution composition containing the curing agent, as given by a rotation viscosity measured by a B-type viscometer at 0° C., is preferably not more than 600 poise, or more preferably not more than 400 poise. When the viscosity of the resin solution composition containing the curing agent is greater than 600 poise, attempts to maintain a high level of productivity often fails by aggravated thickness unevenness and increased air trapping.

In another example of the producing process of the polyimide film of the present invention, the polyamic acid film (gel film) is immersed in tertiary amine or a solution of tertiary amine, or alternatively tertiary amine or a solution of tertiary amine is applied onto the polyamic acid film. That is, the process includes the steps of:

casting or coating an organic solvent solution of polyamic acid on a support and drying it to produce a partially cured and/or partially dried polyamic acid film;

immersing the polyamic acid film in tertiary amine or a solution of tertiary amine, or alternatively applying tertiary amine or a solution of tertiary amine onto the polyamic acid film; and converting the polyamic acid into polyimide by imidization and drying the film.

Imidization of the polyamic acid may be carried out by chemical curing also in this process. In this case, the amount of dehydrating agent is 0.5 to 5 times, preferably 1 to 4 times, or more preferably 1.5 to 3 times the amount in mole of the amic acid in the polyamic acid solution.

The amount of imidizing catalyst is 0.1 to 2 times, or more preferably 0.2 to 1 times the amount in mole of the amic acid in the polyamic acid solution. When the amount of imidizing catalyst is too low, the percentage of imidization may fall below its suitable range. On the other hand, when the amount of imidizing catalyst is too high, the curing rate is increased, which makes it difficult to carry out casting on the support.

The content of remaining volatile component in the gel film is in the range of 5% to 500%, preferably 5% to 100%, more preferably 10% to 80%, and most preferably 30% to 60%. It is preferable that the film satisfy these ranges; otherwise, the film may fail to exhibit its predetermined effects. The percentage of imidization of the gel film is not less than 50%, preferably not less than 80%, more preferably not less than 85%, and most preferably not less than 90%. It is preferable that the film satisfy these ranges; otherwise, the film may fail to exhibit its predetermined effects.

With the producing process of the polyimide film of the present invention, when the content of remaining volatile component and the percentage of imidization of the gel film are in the foregoing ranges, the time for preparing the gel film can be reduced by 10% to 70%, or 20% to 70% of that of conventional gel films.

The partially cured and/or partially dried polyamic acid film obtained by thermal curing or chemical curing is fed to a step in which the partially cured and/or partially dried polyamic acid film is coated with or immersed in tertiary amine or a solution of tertiary amine.

Examples of tertiary amines that are used to coat or immerse the partially cured and/or partially dried polyamic acid film (gel film) include aliphatic tertiary amines, aromatic tertiary amines, and heterocyclic tertiary amines, among which those selected from the heterocyclic tertiary amines are particularly preferable. Specifically, quinoline, isoquinoline, β-picoline, pyridine, and the like are preferable. These tertiary amines may be used individually or in a mixture of two or more kinds. Further, the tertiary amines may be used as the organic solvent solution, in which case the tertiary amines may be diluted with any solvent. The solvents are preferably amide-family solvents such as N,N-dimethylformamide, N,N-dimethylacetoamide, N-methyl-2-pyrrolidone, among which N,N-dimethylformamide and N,N-dimethylacetoamide can be preferably used either individually or in a mixture of any proportions. The solution may be diluted to any concentration but the solution should preferably be adjusted to have a concentration of tertiary amine in the range of 100 wt % to 5 wt %. A solution of an excessively weak concentration fails to achieve an object of the present invention satisfactorily, i.e., to prevent decrease of strengths.

The method by which the gel film is coated with tertiary amine or a solution of tertiary amine may be of any conventional methods known to a person skilled in the art. For example, methods using a gravure coat, a spray coat, or a knife coater can be used, among which a gravure coater can be preferably used in view of ease of control of the amount of tertiary amine or a solution of tertiary amine used to coat the gel film, or evenness of coating. The amount of coating is preferably 1 $g/m^2$ to 40 $g/m^2$, or more preferably 5 $g/m^2$ to 30 $g/m^2$. With an amount below these ranges, it becomes difficult to prevent decrease of strengths. Above these ranges, appearance of the film becomes poor.

The method by which the gel film is immersed in tertiary amine or a solution of tertiary amine is not particularly limited and a common dip coating method is applicable. Specifically, the gel film is immersed in the solution in a tank either continuously or in a batch. The immerse time ranges from 1 to 100 seconds, or preferably 1 to 20 seconds. An immerse time longer than this range results in poor appearance of the film and below this range brings about difficulty in preventing decrease of strengths.

It is preferable that the gel film coated with or immersed in tertiary amine or a solution of tertiary amine is subjected to a step of removing unnecessary droplets on a film surface. In this way, a polyimide film with superior appearance and with no disturbance on a film surface can be obtained. The droplets can be removed by conventionally known methods, including squeezing by a nip roll, an air knife method, a doctor blade method, wiping, and sucking, among which the nip roll method is preferable in view of film appearance, ease of wiping, and workability, etc.

The gel film coated with or immersed in tertiary amine or a solution of tertiary amine is subjected to a heating step with its end portions fastened to avoid shrinkage during thermal treatment. The polyimide film is obtained by removing the moisture, residual solvent, residual converting agent and the catalyst in the gel film, and then by completing imidization of remaining amic acid. Preferably, the temperature conditions of the drying step are such that the final temperature reaches 500° C. to 580° C. and heating is carried out in this temperature range for 1 to 400 seconds. Heating at a higher temperature and/or for a longer period of time causes heat decomposition of the film. On the other hand, heating at a lower temperature and/or for a shorter period of time fails to exhibit predetermined effects.

With the producing process of the polyimide film of the present invention, the polyimide film can be obtained without decrease of mechanical strengths even when the gel film is prepared in a shorter period of time. The shorter time to prepare the gel film improves productivity and prevents decrease of tear propagation strength and adhesion strength. As a result, the polyimide film with improved tensile strength can be obtained.

The polyimide film according to the present invention can be suitably used in flexible printed substrates, magnetic tapes and magnetic disks for general magnetic recording, and passivation films of semiconductor elements of solar cells and the like.

The following describes yet another example of the producing process of the polyimide film of the present invention.

In this example, the gel film is peeled from the support while controlling the remaining volatile component, and the film is subsequently imidized.

That is, the producing process of the polyimide film of the present invention has the following sequence. The dehydrating agent and imidizing catalyst are mixed in an organic solvent solution of polyamic acid. The mixture is then cast on a support and heated to peel a polyamic acid film from the support while leaving a volatile component in the film. The polyamic acid film is partially cured and/or partially dried so that it contains 50 parts by weight or more of catalyst, 30 parts by weight or less of solvent, and 20 parts by weight or less of dehydrating agent and/or dehydrating agent derived component, with respect to 100 parts by weight of the remaining volatile component. Thereafter, a remaining portion of the amic acid is imidized and the film is dried.

The amount of dehydrating agent added with respect to the polyamic acid solution is suitably selected, taking into consideration concentration of the polyamic acid in the solution or density of amic acid bonding sites in the polyamic acid molecules. For example, in an 18.5 wt % polyamic acid containing pyromellitic anhydride and 4,4'-diaminodiphenylether, the dehydrating agent is used in a proportion of 1 part to 80 parts, preferably 5 parts to 70 parts, and more preferably 10 parts to 50 parts with respect to 100 parts of the polyamic acid solution. When the amount of dehydrating agent is excessive, a mixing failure is likely to occur, and when deficient the rate of chemical imidization (curing) tends to be slow.

The amount of imidizing catalyst added with respect to the polyamic acid solution is suitably selected, taking into consideration concentration of the polyamic acid in the solution or density of amic acid bonding sites in the polyamic acid molecules. For example, in an 18.5 wt % polyamic acid containing pyromellitic anhydride and 4,4'-diaminodiphenylether, the dehydrating agent is used in a proportion of 0.1 to 30 parts, preferably 0.5 to 20 parts, and more preferably 1 to 15 parts with respect to 100 parts of the polyamic acid solution. When the amount of imidizing catalyst is deficient, the chemical imidization (curing) becomes sluggish, and when excessive the rate of chemical imidization (curing) is increased and casting on the support becomes difficult.

The dehydrating agent and the imidizing catalyst are mixed at a low temperature in the polyamic acid solution, and the mixture of the polyamic acid solution is cast in the form of a film on the support such as a glass plate, an aluminum foil, an endless stainless-steel belt, or a stainless-steel drum. The film on the support is heated in a temperature range of 80° C. to 200° C., or preferably 100° C. to 180° C. so as to activate the dehydrating agent and the catalyst and peel the partially cured and/or partially dried film from the support and thereby obtain the gel film.

The content of remaining volatile component is in the range of from 5 wt % to 500 wt %, preferably 10 wt % to 200 wt %, more preferably 10 wt % to 80 wt %, or most preferably 30 wt % to 60 wt %. It is preferable that the film satisfies these ranges. In practice, the film is preferably produced with the content of remaining volatile component not more than 100 wt %. With a content outside of this range, predetermined effects may not be obtained.

The gel film is heated under such heating conditions that the gel film contains the catalyst in an amount of 50 wt % or greater, preferably 60 wt % or greater, and more preferably 70 wt % or greater, and contains a remaining chief solvent in an amount of 30 wt % or less, preferably 25 wt % or less, and more preferably 20 wt % or less, and contains the dehydrating agent and/or the dehydrating derived component in an amount of 20 wt % or less, preferably 15 wt % or less, and more preferably 10 wt % or less, all with respect to 100 wt % of the total remaining volatile component in the gel film (disregarding water content), as quantified by gas chromatography, after extracting the catalyst from the gel film in N-methyl-2-pyrolidone for 48 hours with concussion. Specific examples of heating conditions include a change in weight ratio of the chief solvent and the catalyst, a change of drying temperature, a change in volume of hot air, a change in wind speed of hot air, a change of heating time, and a change in temperature of the support. These conditions vary depending on such factors as the boiling points of the catalyst and the chief solvent, the amount of catalyst added, the thickness of the film, the type of polyamic acid, and the production rate.

When the content of the catalyst, solvent, and dehydrating agent and/or dehydrating agent component fall out of the foregoing ranges, it becomes difficult to achieve objects of the present invention, i.e., to improve productivity and to prevent decrease of strengths at the same time.

By heating the gel film with its end portions fastened and by completely imidizing the amic acid, the producing process of the present invention can produce the polyimide film with improved productivity and without decrease of tear propagation strength, adhesion strength, and tensile strength.

Here, it is preferable that the final temperature and time of heating be 500° C. to 580° C. and for 15 to 400 seconds. A higher temperature and/or a longer time cause heat decomposition, which may lead to problems. Conversely, with a lower temperature and/or a shorter time, it becomes difficult to obtain predetermined effects.

It is desirable that heating temperatures and heating times in all stages of heating in the present producing process be so adjusted that the percentage of weight loss by heating of the polyimide film, which is determined from $$\text{(The percentage of weight loss by heating)} = (X-Y)/Y \quad (3)$$

where X is the mass of the film after 10 minute heating at 150° C., and Y is the mass of the film after 20 minute heating at 450° C., is 0.2 wt % to 2.5 wt %, preferably 0.3 wt % to 2.0 wt %, more preferably 0.3 wt % to 1.5 wt %, and most preferably 0.5 wt % to 1.5 wt %. It is also desirable that, with respect to the total weight of the film, the catalyst makes up 0.01 wt % or greater, preferably 0.05 wt % or greater, or more preferably 0.1 wt % or greater of the percentage of weight loss by heating. When the percentage of weight loss by heating and the content of the lost weight by heating fall outside of the foregoing ranges, predetermined effects may not be obtained.

The lost weight by heating is measured as follows. The film is wrapped with a tared aluminum foil and heated at 150° C. for 10 minutes. Out of the oven after 10 minutes, the film is immediately transferred to a desiccater. After cooling for 2 minutes, the weight of the film including the aluminum foil is measured and the tare in the aluminum foil is subtracted to give initial weight X. After measuring initial weight X, the film is heated again at 450° C. for 20 minutes. Out of the oven after 20 minutes, the film is immediately transferred to a desicater. After cooling for 2 minutes, the weight of the film including the aluminum foil is measured and the tare in the aluminum foil is subtracted to give weight Y after heating. The film is highly moisture absorptive and the operations of the measurement must be carried out quickly.

The following describes still another example of the producing process of the polyimide film of the present invention. The producing process includes a step of casting a polyamic acid composition on a support and continuously heating the polyamic acid composition on the support at at least two levels of temperatures.

That is, the producing process of the polyimide film according to the present invention has the following sequence. The dehydrating agent and the imidizing catalyst are mixed in an organic solvent solution of polyamic acid. The resulting polyamic acid composition is then cast on the support and heated on the support at temperatures of two or more levels. Then, the film is detached from the support to obtain a partially cured and/or partially dried polyamic acid film. Finally, remaining amic acid is imidized and the film is dried.

The amount of dehydrating agent is 1 to 80 parts, preferably 5 to 70 parts, and more preferably 10 to 50 parts, with respect to 100 parts of the polyamic acid solution. When the amount of dehydrating agent is too low, the percentage of imidization may fall below the preferable range. On the other hand, when the amount of imidizing catalyst is too high, the curing rate becomes faster, which makes it difficult to carry out casting on the support.

The amount of imidizing catalyst is 0.1 to 30 parts, preferably 0.5 to 20 parts, and more preferably 1 to 15 parts, with respect to 100 parts of the polyamic acid solution. When the amount of imidizing catalyst is too low, percent imidization may fall below the preferable range. On the other hand, when the amount of imidizing catalyst is too high, the curing rate becomes faster, which makes it difficult to carry out casting on the support.

The dehydrating agent and the imidizing catalyst are mixed at a low temperature in the polyamic acid solution, and the mixture of the polyamic acid solution is cast in the form of a film on the support such as a glass plate, an aluminum foil, an endless stainless-steel belt, or a stainless-steel drum. The film on the support is heated stepwise at temperatures of at least two levels in a temperature range of 80° C. to 200° C., or preferably 100° C. to 180° C. so as to activate the dehydrating agent and the catalyst and detach the partially cured and/or partially dried film from the support and thereby obtain the gel film.

The content of remaining volatile component is in the range of from 5 wt % to 500 wt %, preferably 5 wt % to 100 wt %, more preferably 10 wt % to 80 wt %, or most preferably 30 wt % to 60 wt %. It is preferable that the film satisfies these ranges. With the content outside of these ranges, predetermined effects may not be obtained.

In the stepwise heating at temperatures of at least two levels, it is preferable that the first heating be carried out at a temperature of 80° C. to 160° C., or more preferably 100° C. to 140° C. Here, when temperature T1 of the first heating is too low, the content of volatile component in the gel film tends to be high, whereas when too high the rate of volatilization of the dehydrating agent and the catalyst becomes faster and the chemical imidization becomes sluggish.

Further, in the stepwise heating at temperatures of at least two levels, it is preferable that the last heating be carried out at a temperature of 120° C. to 200° C., or more preferably 140° C. to 180° C. Here, when the temperature T2 is too low, the content of volatile component in the gel film tends to be high. Controlling the content of volatile component in the gel film within a suitable range requires a longer heating time. That is, productivity suffers. On the other hand, when temperature T2 is too high, the content of volatile component in the gel film tends to fall below the suitable range and predetermined effects may not be obtained.

When the stepwise heating is to be carried out at temperatures of three or more levels, intermediary heating other than the first and last heating should preferably be carried out at 80° C. to 200° C., or preferably 100° C. to 180° C.

Further, in the stepwise heating at temperatures of at least two levels, it is required in an early stage of heating to activate the dehydrating agent and the catalyst to allow curing while suppressing volatilization of the dehydrating agent and the catalyst, while drying needs to be promoted in a late stage of heating. It is therefore preferable that the heating temperature be increased as the heating stage proceeds.

A range of temperature fluctuations of temperature T1 in the first stage should preferably be within −10° C. to +10° C., or more preferably −5° C. to +5° C. Similarly, a range of temperature fluctuations of temperature T2 in the last stage should preferably be within −10° C. to +10° C., or more preferably −5° C. to +5° C. A similar range of temperature fluctuations is optionally employed at heating temperatures of the third and subsequent stages.

For a shorter production time, a transition of heating from temperature T1 to temperature T2 should be completed in a short period of time.

By heating the gel film with its end portions fastened to avoid shrinkage, followed by removal of water, the remaining solvent, and the residual converting agent and the catalyst, and finally by completely imidizing the amic acid, the producing process of the present invention can produce the polyimide film with improved productivity and without decrease of tear propagation strength, adhesion strength, and tensile strength.

Here, it is preferable that the final temperature and time of heating be 500° C. to 580° C. and for 5 to 400 seconds. A higher temperature and/or a longer time cause heat decomposition, which may lead to problems. Conversely, with a lower temperature and a shorter time, it becomes difficult to obtain predetermined effects.

It is desirable that heating temperatures and heating times in all stages of heating in the present producing process be so adjusted that percent weight loss by heating of the polyimide film, which is determined from the foregoing equation (3), is 0.2 wt % to 2.5 wt %, preferably 0.3 wt % to 2.0 wt %, more preferably 0.3 wt % to 1.5 wt %, and most preferably 0.5 wt % to 1.5 wt %. It is also desirable that, with respect to the total weight of the film, the catalyst makes up 0.01 wt % or greater, preferably 0.05 wt % or greater, or more preferably 0.1 wt % or greater of the percent weight loss by heating. When the percent weight loss by heating and the content of the lost weight by heating fall outside of the foregoing ranges, predetermined effects may not be obtained.

Further, the polyimide film of the present invention has a width of not less than 1 m during production, wherein a ratio of maximum value to minimum value of tear propagation strength measured across the entire width is 0.7 or greater, and an R value, which is obtained when measuring the tear propagation strength of an outermost portion, is 0.6 g or smaller. That is, curing of the outermost portion is sufficient and unevenness of curing from the central portion is small.

Here, the ratio of maximum value to minimum value of tear propagation strength is preferably 0.7 or greater, more preferably 0.75 or greater, or even more preferably 0.80 or greater. The optimum curing temperature, which varies depending on the type of polyimide, is suitably set. The tear propagation strength generally becomes larger when curing is insufficient and becomes smaller when there is over-curing. Thus, where a ratio of maximum value to minimum value of tear propagation strength is below 0.7, physical properties in one location of the film in the transverse direction often become profoundly different from physical properties in another location of the film in the transverse direction. The ratio of maximum value to minimum value of tear propagation strength measured across the entire width is a value that is obtained by calculating (minimum value)/(maximum value) of tear propagation strength that was measured according to ASTM D-1938 on samples collected in the transverse direction of the film at 10 cm intervals.

It is preferable that the R value when measuring tear propagation strength of the outermost portion is 0.6 g or less, preferably 0.4 g or less, and more preferably 0.3 g or less. An R value above 0.6 g often results in extreme under-curing or extreme over-curing. The R value when measuring tear propagation strength of the outermost portion is the difference between a measured maximum value and a measured minimum value of a sample of 2.5 cm (width)×7.5 cm, which is collected out of the film, using a reference point 10 mm inside the fastened point of the film where pins or clips are used.

The polyimide film of the present invention is obtained, for example, by a process of casting a resin solution which is prepared by addition of a curing agent containing 1.0 to 3.0 mole equivalent of dehydrating agent and not less than 0.3 mole equivalent of imidizing catalyst with respect to the amic acid in an organic solvent solution of polyamic acid.

The dehydrating agent is used in 1.0 to 3.0 mole equivalent, or preferably 1.5 to 2.5 mole equivalent with respect to the amic acid, and the imidizing catalyst is used in a not less than 0.3 mole equivalent, or more preferably not less than 0.4 mole equivalent with respect to the amic acid. When the amount of dehydrating agent falls outside of the preferable ranges, the properties of the polyimide film may decrease. When the amount of imidizing catalyst is too low, the chemical imidization becomes insufficient and the properties of the polyimide film often decrease.

The polyimide film is prepared as a gel film that is formed by mixing the polyamic acid varnish and the curing agent of the foregoing process and then continuously extruding the mixture in the form of a thin flat curtain from the slit die so as to cast it on a support such as a stainless-steel drum or an endless belt. The gel film is heated on the support in the temperature range of from 80° C. to 200° C., or preferably 100° C. to 180° C., so as to activate the dehydrating agent and the imidizing catalyst. The resulting gel film, partially cured and/or partially dried, is detached from the support.

The content of volatile component of the gel film is 5% to 500%, preferably 5% to 100%, more preferably 10% to 80%, and most preferably 30% to 60%. The film preferably should satisfy these ranges; otherwise the film may fail to exhibit superior mechanical strengths.

By heating the gel film with its end portions fastened to avoid shrinkage, followed by removal of water, the remaining solvent, and the residual converting agent and the catalyst, and finally by completely imidizing the amic acid, the producing process of the present invention can produce the polyimide film with small unevenness of mechanical properties across the entire width.

Here, it is preferable that the final temperature and time of heating be 500° C. to 580° C. and for 5 to 400 seconds. A higher temperature and/or a longer time often cause heat decomposition, which may result in uneven curing in the transverse direction.

The following describes another example of the polyimide film of the present invention.

The polyimide film of the present invention is produced with a film width of not less than 1250 mm, wherein the molecular orientation MOR-c is 1.30 or less at any point of the film, and the tensile modulus is not less than 2.5 GPa and not more than 5.0 GPa.

Such a polyimide film is produced, for example, by a process in which a polyamic acid mixed solution containing polyamic acid, a dehydrating agent, an imidizing catalyst, and an organic solvent is cast on a support to form a film that is partially cured and/or partially dried until it becomes self-supporting, and the gel film, with its both ends fastened, is passed a heating furnace, wherein (1) the polyamic acid mixture solution is a mixture of dehydrating agent, 1.0 to 5.0 equivalent, and imidizing catalyst, 0.2 to 2.0 equivalent, with respect to the amic acid unit, and (2) the initial heating temperature in the heating furnace is controlled to be no more than +100° C. of a temperature of the support and within 150° C. to 250° C.

In order to minimize shrinkage of the film during heating and/or partially drying of the film on the support, the amount of dehydrating agent should be adjusted to preferably 1.0 to 5.0 equivalent, more preferably 2.0 to 4.0 equivalent, and most preferably 1.5 to 3.0 equivalent, with respect to the amic acid unit of the polyamic acid. Outside these ranges, a film with good isotropy may not be obtained. Below 1.0, imidization becomes insufficient and the gel film with sufficient strengths cannot be obtained. In addition, it becomes difficult to remove the gel film from the support. Above 5.0, the rate of imidization of polyamic acid becomes faster and proper adhesion of the gel film with the support cannot be obtained, causing the gel film to shrink on the support.

The amount of imidizing catalyst added should be adjusted to preferably 0.1 to 2.0 equivalent, more preferably 0.3 to 1.5 equivalent, and most preferably 0.5 to 1.0 equivalent, with respect to the amic acid unit of the polyamic acid.

When the amount of imidizing catalyst exceeds 2.0, the rate of imidization of polyamic acid becomes faster and partial imidization occurs on the support or in the mixing process with the polyamic acid, causing gel defects on the film. In other cases, the slit die is clogged with the defect gel to cause stripe defects. Below 0.1, curing and/or drying on the support often become insufficient and mechanical properties suffer.

The polyamic acid mixed solution containing a mixture of dehydrating agent and imidizing catalyst in the suitable range is cast in the form of a film through the slit die on the support such as a rotary metal drum or an endless belt. The film is partially cured and/or partially dried on the support by heating to obtain a self-supporting gel film. The polyamic acid mixed solution cast on the support may be heated by hot air or by the heat of far IR radiation. Alternatively, the support itself may be heated. Further, the method employing hot air or far IR radiation and the method of heating the support itself may be carried out together.

Percent imidization is not less than 50%, preferably not less than 80%, or most preferably not less than 90%. It is preferable that "partial imidization" falls in these ranges. Outside these ranges, predetermined effects may not be obtained.

The content of remaining volatile component is in the range of 15% to 300%, preferably 15% to 150%, more preferably 30% to 80%, and most preferably 30% to 60%. It is preferable that the content of remaining volatile component of the gel film falls in these ranges. Heating the gel film on the support below these ranges not only imidizes and dries the film but promotes heat decomposition, with the result that sufficient strengths may not be obtained for the polyimide film. Above these ranges, the film may be broken in a later heating step and productivity suffers.

The gel film, with its both ends fastened with pins or clips, is transported to a heating furnace, where the gel film is dried to remove the volatile component of the organic solvent, etc., and then subjected to a heat treatment to obtain the polyimide film. The heating furnace may be adapted to continuously apply heat in response to transport of the film, or apply heat stepwise. The two structures are essentially the same, and it is preferable in either case that the initial heating temperature is not more than an ambient temperature+100° C. of a temperature of the support, or more preferably an ambient temperature+80° C. of a temperature of the support. It is also important that the ambient temperature be controlled within the range of 150° C. to 250° C., or more preferably 180° C. to 200° C. When the temperature difference between the support and the heating furnace falls outside these ranges, the film with desirable isotropy may not be obtained. Further, when the initial heating temperature falls outside the foregoing ranges, the volatile component contained in the gel film may boil to cause bubble defects on a film surface, in which case smoothness of the film may be lost.

The final step of the producing process of the polyimide film of the present invention is the heating step of 450° C. to 580° C. for 15 to 400 seconds, or preferably 500° C. to 580° C. for 15 to 400 seconds.

The film of the present invention with a 1250 mm or greater thickness is produced with this thickness through the heating furnace. Thus, the present invention is particularly effective in a producing step of producing a film of such a wide width. The product film may be cut into a predetermined width.

The isotropic polyimide film so produced has small anisotropy of molecular orientation at any point of the film in the direction of width. That is, by a molecular orientation MOR-c of not more than 1.3, or preferably not more than 1.2 at any point of the film in the transverse direction, it is possible to minimize changes in properties of the film, such as modulus, tensile strength, and coefficient of thermal expansion, which vary depending on the direction of measurement. That is, the polyimide film can be suitably applied to those materials for which particularly high dimensional stability is needed, for example, such as flexible printed circuit boards on which a metal foil or a metal thin film is laminated, TAB carrier tapes, or cover lay films for flexible printed circuit boards.

The following describes another example of the polyimide film of the present invention.

The polyamic acid used in the present invention is usually produced by dissolving essentially equimolar amounts of at least one kind of aromatic acid dianhydrides and at least one kind of aromatic diamines in an organic solvent, and by stirring the resultant polyamic acid organic solvent solution under controlled temperature conditions until polymerization of the acid dianhydrides and diamines proceeds to completion. The polyamic acid solution is usually used in a concentration of 15 wt % to 25 wt %. With a concentration in this range, a suitable molecular weight and a suitable solution viscosity can be obtained.

The imidization in the present invention can be suitably carried out by chemical curing.

In this example, 4,4'-diaminodiphenylether and p-phenylenediamine should preferably be used in combination as the diamine. Particularly, in order to improve modulus and realize low coefficient of thermal expansion that compares to that of metals, the proportion of p-phenylenediamine component with respect to the diamine should preferably be not less than 20 mole % and not more than 65 mole %, or more preferably not less than 25 mole % and not more than 50 mole %. Below this range, the effects of the present invention may not be obtained. Above this range, the coefficient of thermal expansion often becomes too low to be used in such flexible printed circuit boards in which the metal layer is laminated either directly or via an adhesive agent.

In this example, the proportion of dehydrating agent is 1 to 80 parts, preferably 5 to 70 parts, or more preferably 10 to 50 parts, with respect to 100 parts of polyamic acid organic solvent solution.

In this example, the proportion of imidizing catalyst is 0.1 to 30 parts, preferably 0.5 to 20 parts, or more preferably 1 to 15 parts, with respect to 100 parts of polyamic acid organic solution. When the proportion of imidizing agent is too low, percent imidization may fall below its suitable ranges. When too high, the curing rate increases and it becomes difficult to carry out casting on the support.

In this example, percent imidization as given by the foregoing equation (2) is not less than 50%, preferably not less than 70%, or more preferably not less than 80%. The "partial imidization" should preferably be percent imidization in these ranges. Below these ranges, it becomes difficult to remove the gel film from the support or the ease of self-supporting may suffer.

Further, in this example, the content of remaining volatile component in the gel film as given by the foregoing equation (1) is in the range of from 50% to 300%, preferably 80% to 250%, or more preferably 100% to 200%. It is preferable that the film satisfies these ranges. With a gel film whose content of remaining volatile component exceeds these ranges, the gel film may not become self-supporting sufficiently, or may be stretched or broken during transport to the heating furnace, with the result that production becomes unstable. With a gel film whose content of remaining volatile component falls below the foregoing ranges, predetermined effects may not be obtained.

The gel film is subsequently heated to remove (dry) the remaining solvent and to finish curing (imidization). Here, in order to avoid the gel film from shrinkage during drying and curing, it is required that the gel film be transported to the heating furnace by being held on a tenter frame with pins or tenter clips, etc., at its end portions. The initial temperature of the heating furnace is preferably 200° C. to 400° C., or more preferably 250° C. to 350° C. to obtain the predetermined effect more effectively. With a temperature above these ranges, the film may break in the heating furnace in response to sudden heat. In other cases, foaming defects may occur on a surface of the film by boiling of the remaining volatile component such as the solvent. In a lower temperature range, predetermined effects may not be obtained.

As described, the inventors of the present invention have found that controlling the content of remaining volatile component in the gel film and the initial temperature of the tenter heating furnace within a specific range has direct effect on modulus and coefficient of thermal expansion of the product polyimide film. Specifically, such an effect can be obtained most effectively under the following conditions, without causing breakage of the gel film or foaming on a surface of the film and thus with good productivity.

In a relatively lower range of the foregoing suitable ranges of the remaining volatile component, i.e., in the range of 50 wt % to 150 wt %, preferably 80 wt % to 150 wt %, and more preferably 100 wt % to 150 wt %, the initial temperature in the tenter heating furnace should be set in the range of 250° C. to 400° C., more preferably 300° C. to 400° C., or most preferably 350° C. to 400° C. Here, a high temperature can be set for the initial temperature of the tenter heating furnace because the gel film, with the low volatile component content, is highly self-supporting and rarely causes breakage of the film or boiling of the remaining volatile component.

On the other hand, in a relatively higher range of the foregoing suitable ranges of the remaining volatile component, i.e., in the range of 150 wt % to 300%, preferably 150 wt % to 250 wt %, and more preferably 150 wt % to 200 wt %, the initial temperature in the tenter heating furnace should be set in the range of 200° C. to 350° C., more preferably 200° C. to 300° C., or most preferably 200° C. to 250° C. The gel film, with a high volatile component content, is less self-supporting. Thus, in order to obtain the effects of the present invention without lowering productivity, the initial temperature of the tenter heating furnace is set in a relatively lower range of the suitable range.

The content of remaining volatile component in the gel film is restricted in some way by the type and thickness of polyimide resin, the type of solvent used, and the time and capacity of heating on the support. In any case, the content of remaining volatile component is controlled in the foregoing suitable ranges to set the initial temperature in the tenter heating furnace.

The producing process of the polyimide film according to the present invention is finished by a heating step at 450° C. to 600° C., or preferably at 500° C. to 600° C., for 15 to 400 seconds. The heating furnace may be adapted to apply heat continuously (stepless) until the temperature reaches a temperature, known as the highest curing temperature, in the foregoing preferable ranges, or apply heat stepwise. The two structures are essentially the same, and it is important in either case that the initial heating temperature is in the foregoing suitable ranges.

The polyimide film so produced has a larger birefringence, a higher modulus, and a lower coefficient of thermal expansion than those of a polyimide film that is obtained by a deposition method using the same material (the precursor is the same polyamic acid). For example, a polyimide film with a birefringence of 0.15 or greater can be obtained. More specifically, with the process of the present invention, modulus can be increased within 1.0 GPa and coefficient of thermal expansion can be increased within 4 ppm. That is, the present invention can produce the polyimide film that can be suitably used in ever more precise base films of flexible printed circuit boards, cover lay films, or base films for TAB carrier tapes.

Referring to Examples, the following specifically describes effects of the present invention. The present invention however is not limited by any ways by the following Examples and various changes, corrections, and modifications are possible by a person ordinary skill in the art within the scope of the present invention.

The tear propagation strength and tensile strength of the polyimide films were measured according to ASTM D-1938 and JIS C-2318, respectively.

The adhesion strength was evaluated using a trilayer copper-clad laminate, which was prepared by laminating an electrolytic copper foil (Mitsui Mining 86 Smelting Co., Ltd.; product name 3ECVLP; thickness 35 µm) and the polyimide film, wherein the evaluation was carried out at a 90° peel and a copper pattern width of 3 mm, according to JIS C-6481.

The temperature conditions in the heating step of the gel film were the same in Comparative Examples and Examples.

Comparative Example 1

Polyamic acid was synthesized from a 4:3:1 mole ratio of pyromellitic dianhydride, 4,4'-diaminodiphenylether, and p-phenylenediamine. 100 g of a DMF solution containing 18.5 wt % of the polyamic acid was prepared and then mixed with a converting agent containing 35 g of acetic anhydride and 5 g of β picoline. The mixture was stirred, defoamed by centrifugation, and coated by casting on an aluminum foil to a thickness of 400 µm. The processes of stirring to defoaming were carried out while cooling to 0° C. The laminate of aluminum foil and polyamic acid solution was then heated at 120° C. for 150 seconds to obtain a self-supporting gel film. The content of remaining volatile component of the gel film was 41 wt % and percent imidization was 81%. The gel film was then detached from the aluminum foil and anchored on a frame. The gel film was heated at 300° C., 400° C., and 500° C. for 30 seconds at each temperature, so as to produce a polyimide film with a thickness of 25 µm. Table 1 shows basic mechanical properties of this polyimide film.

Comparative Example 2

A polyimide film with a thickness of 25 µm was produced in exactly the same manner as in the Comparative Example 1, except that the laminate of aluminum foil and polyamic acid solution was heated at 160° C. for 75 seconds. The content of remaining volatile component in the gel film in an intermediate stage was 36 wt % and percent imidization was 78%. Table 1 shows basic mechanical properties of this polyimide film.

Comparative Example 3

A polyimide film with a thickness of 25 µm was produced in exactly the same manner as in the Comparative Example 1, except that a 1:1 mole ratio of pyromellitic dianhydride and 4,4'-diaminodiphenylether were used. The content of remaining volatile component in the gel film in an intermediate stage was 40 wt % and percent imidization was 89%. Table 1 shows tear propagation strength of this polyimide film.

Comparative Example 4

A polyimide film with a thickness of 25 µm was produced in exactly the same manner as in the Comparative Example 3, except that the laminate of aluminum foil and polyamic acid solution was heated at 160° C. for 75 seconds. The content of remaining volatile component in the gel film in an intermediate stage was 38 wt % and percent imidization was 87%. Table 1 shows basic mechanical properties of this polyimide film.

It can be seen from the comparison of Comparative Examples 1 and 2 and Comparative Examples 3 and 4 that the mechanical strengths, including tear propagation strength, tensile strength, and adhesion strength, become weaker as the fabrication time of the gel film becomes shorter.

Example 1

As in Comparative Example 2, a gel film with a 48 wt % content of remaining volatile component and 78% percent imidization was obtained. The gel film was dipped in isoquinoline and unnecessary droplets were removed through a nip roll. The gel film was then heated at 300° C., 400° C., and 500° C. for 30 seconds at each temperature, so as to produce a polyimide film with a thickness of 25 μm. Table 1 shows basic mechanical properties of this polyimide film.

Example 2

As in Comparative Example 2, a gel film with a 53 wt % content of remaining volatile component and 78% percent imidization was obtained. The gel film was dipped in a 35 wt % DMF solution of isoquinoline and unnecessary droplets were removed by spraying compressed air. The gel film was then heated under the same heating conditions as in Comparative Example 2 to obtain a polyimide film with a thickness of 25 μm. Table 1 shows basic mechanical properties of this polyimide film.

Example 3

As in Comparative Example 4, a gel film with a 49 wt % content of remaining volatile component and 87% percent imidization was obtained. The gel film was dipped in isoquinoline and unnecessary droplets were removed by spraying compressed air. The gel film was then heated under the same heating conditions as in Comparative Example 4 to obtain a polyimide film with a thickness of 25 μm. Table 1 shows basic mechanical properties of this polyimide film.

Example 4

As in Comparative Example 4, a gel film with a 52 wt % content of remaining volatile component and 87% percent imidization was obtained. The gel film was dipped in a 35 wt % DMF solution of isoquinoline and unnecessary droplets were removed by spraying compressed air. The gel film was then heated under the same heating conditions as in Comparative Example 2 to obtain a polyimide film with a thickness of 25 μm. Table 1 shows basic mechanical properties of this polyimide film.

Example 5

As in Comparative Example 4, a gel film with a 51 wt % content of remaining volatile component and 85% percent imidization was obtained. The gel film was dipped in β picoline and unnecessary droplets were removed by spraying compressed air. The gel film was then heated under the same heating conditions as in Comparative Example 2 to obtain a polyimide film with a thickness of 25 μm. Table 1 shows basic mechanical properties of this polyimide film.

Example 6

Polyamic acid was synthesized from a 1:1 mole ratio of pyromellitic dianhydride and 4,4'-diaminodiphenylether. 100 g of a DMF solution containing 18.5 wt % of the polyamic acid was prepared and then mixed with a converting agent containing 35 g of acetic anhydride and 5 g of β picoline. The mixture was stirred, defoamed by centrifugation, and coated by casting on an aluminum foil to a thickness of 400 μm. The processes of stirring to defoaming were carried out while cooling to 0° C. The laminate of aluminum foil and polyamic acid solution was then heated at 140° C. for 110 seconds to obtain a self-supporting gel film. The content of remaining volatile component of the gel film was 46 wt % and percent imidization was 82%. The gel film was dipped in isoquinoline and unnecessary droplets were removed through a nip roll. The gel film was then heated at 300° C., 400° C., and 500° C. for 30 seconds each, so as to produce a polyimide film with a thickness of 25 μm. Table 1 shows basic mechanical properties of this polyimide film.

Example 7

Polyamic acid was synthesized from a 1:1 mole ratio of pyromellitic dianhydride and 4,4'-diaminodiphenylether. 100 g of a DMF solution containing 18.5 wt % of the polyamic acid was prepared and then mixed with a converting agent containing 35 g of acetic anhydride and 5 g of β picoline. The mixture was stirred, defoamed by centrifugation, and coated by casting on an aluminum foil to a thickness of 400 μm. The processes of stirring to defoaming were carried out while cooling to 0° C. The laminate of aluminum foil and polyamic acid solution was then heated at 170° C. for 60 seconds to obtain a self-supporting gel film. The content of remaining volatile component of the gel film was 42 wt % and percent imidization was 88%. The gel film was dipped in isoquinoline and unnecessary droplets were removed through a nip roll. The gel film was then heated at 300° C., 400° C., and 500° C. for 30 seconds each, so as to produce a polyimide film with a thickness of 25 μm. Table 1 shows basic mechanical properties of this polyimide film.

TABLE 1

| | POLYIMIDE STRUCTURE | TERTIARY AMINE | HEATING TEMP. (° C.) | PRODUCTION TIME OF GEL FILM (SEC.) | TEAR PROPAGATION STRENGTH (g/mm) | TENSILE STRENGTH (kg/mm$^2$) | ELONGATION (%) | ADHESION STRENGTH (N/cm) |
|---|---|---|---|---|---|---|---|---|
| COMPARATIVE EXAMPLE 1 | PMDA/4,4' ODA/p-PDA | NONE | 120 | 150 | 267 | 285 | 70 | 11.0 |
| COMPARATIVE EXAMPLE 2 | | | 160 | 75 | 220 | 263 | 71 | 8.9 |
| COMPARATIVE EXAMPLE 3 | PMDA/4,4' ODA | | 120 | 150 | 325 | 240 | 99 | 11.1 |
| COMPARATIVE EXAMPLE 4 | | | 160 | 75 | 253 | 222 | 101 | 9.2 |

TABLE 1-continued

| | POLYIMIDE STRUCTURE | TERTIARY AMINE | HEATING TEMP. (° C.) | PRODUCTION TIME OF GEL FILM (SEC.) | TEAR PROPAGATION STRENGTH (g/mm) | TENSILE STRENGTH (kg/mm$^2$) | ELONGATION (%) | ADHESION STRENGTH (N/cm) |
|---|---|---|---|---|---|---|---|---|
| EXAMPLE1 | PMDA/4,4' | ISOQUINOLINE | 160 | 75 | 265 | 310 | 71 | 10.9 |
| EXAMPLE2 | ODA/p-PDA | ISOQUINOLINE/ 35 WT % DMF | | | 263 | 307 | 72 | 11.3 |
| EXAMPLE3 | PMDA/4,4' | ISOQUINOLINE | | | 331 | 258 | 103 | 10.9 |
| EXAMPLE4 | ODA | ISOQUINOLINE/ 35 WT % DMF | | | 323 | 265 | 98 | 11.2 |
| EXAMPLE 5 | | β PICOLINE | 160 | 75 | 320 | 263 | 100 | 11.0 |
| EXAMPLE 6 | | ISOQUINOLINE | 140 | 110 | 318 | 256 | 100 | 11.0 |
| EXAMPLE 7 | | ISOQUINOLINE | 170 | 60 | 315 | 260 | 98 | 10.8 |

In the Table, PMDA indicates pyromellitic dianhydride, 4,4'ODA the 4,4'-diaminodiphenylether, and p-PDA the p-phenylenediamine.

Examples 1 through 7 despite their shorter production time have values of mechanical strengths that compare to those of polyimide films of Comparative Examples 1 and 3 with longer production time.

It is therefore possible by the present invention to produce polyimide films with superior mechanical properties and with good productivity.

In the following Examples and Comparative Examples, evaluations of tear propagation strength and tensile strength of the polyimide films were carried out according to ASTM D-1938 and JIS C-2318, respectively. The adhesion strength was evaluated using a trilayer copper-clad laminate, which was prepared by laminating an electrolytic copper foil (Mitsui Mining 86 Smelting Co., Ltd.; product name 3ECVLP; thickness 35 μm) and the polyimide film, wherein the evaluation was carried out at a 90° peel and a copper pattern width of 3 mm, according to JIS C-6481.

The amount of catalyst in a weight loss on heating was decided by pyrolysis gas chromatography (using the Hewlett-Packard Co. product HP5890-II; pyrolysis conditions: 445° C., 20 seconds).

Comparative Example 5

Polyamic acid was synthesized from a 4:3:1 mole ratio of pyromellitic dianhydride, 4,4'-diaminodiphenylether, and p-phenylenediamine. 100 g of a DMF solution containing 18.5 wt % of the polyamic acid was prepared and then mixed with a converting agent containing 35 g of acetic anhydride and 5 g of β picoline. The mixture was stirred, defoamed by centrifugation, and coated by casting on an aluminum foil to a thickness of 400 μm. The processes of stirring to defoaming were carried out while cooling to 0° C. The laminate of aluminum foil and polyamic acid solution was then heated at 120° C. for 150 seconds to obtain a self-supporting gel film. The content of remaining volatile component of the gel film was 38 wt %. The gel film was then detached from the aluminum foil and anchored on a frame. The gel film was heated at 300° C., 400° C., and 500° C. for 30 seconds each, so as to produce a polyimide film with a thickness of 25 μm. Table 2 shows basic mechanical properties of this polyimide film.

Comparative Example 6

A polyimide film with a thickness of 25 μm was produced in exactly the same manner as in the Comparative Example 5, except that the laminate of aluminum foil and polyamic acid solution was heated at 160° C. for 75 seconds. The content of remaining volatile component in the gel film in an intermediate stage was 39 wt %. Table 2 shows basic mechanical properties of this polyimide film.

Example 8

Polyamic acid was coated by casting on an aluminum foil as in the Comparative Example 5. A laminate of the aluminum foil and the polyamic acid solution was heated at 120° C. for 10 seconds, 140° C. for 10 seconds, and 160° C. for 55 seconds, so as to obtain a self-supporting gel film. The content of remaining volatile component of the gel film was 56 wt %. The gel film was then heated at 300° C., 400° C., and 500° C. for 30 seconds at each temperature to produce a polyimide film with a thickness of 25 μm. Table 2 shows basic mechanical properties of the polyimide film.

Comparative Example 7

A polyimide film with a thickness of 25 μm was produced in exactly the same manner as in the Comparative Example 5, except that a 1:1 mole ratio of pyromellitic dianhydride and 4,4'-diaminodiphenylether were used. The content of remaining volatile component in the gel film in an intermediate stage was 35 wt %. Table 2 shows basic mechanical properties of the polyimide film.

Comparative Example 8

A polyimide film with a thickness of 25 μm was produced in exactly the same manner as in the Comparative Example 7, except that the laminate of aluminum foil and polyamic acid solution was heated at 160° C. for 75 seconds. The content of remaining volatile component in the gel film in an intermediate stage was 37 wt %. Table 2 shows basic mechanical properties of the polyimide film.

Example 9

Polyamic acid was coated by casting on an aluminum foil as in the Comparative Example 7. A laminate of the aluminum foil and the polyamic acid solution was heated at 120° C. for 10 seconds, 140° C. for 10 seconds, and 160° C. for 55 seconds, so as to obtain a self-supporting gel film. The content of remaining volatile component of the gel film was 54 wt %. The gel film was then heated at 300° C., 400° C., and 500° C. for 30 seconds at each temperature to produce a polyimide film with a thickness of 25 μm. Table 2 shows basic mechanical properties of the polyimide film.

TABLE 2

| | POLYIMIDE STRUCTURE | PRODUCTION TIME OF GEL FILM (SEC.) | TEAR PROPAGATION STRENGTH (g/mm) | TENSILE STRENGTH (kg/mm$^2$) | ELONGATION (%) | ADHESION STRENGTH (N/cm) | WEIGHT LOSS (wt %) | AMOUNT OF REMAINING CATALYST (wt %) |
|---|---|---|---|---|---|---|---|---|
| COMPARATIVE EXAMPLE 5 | PMDA/4,4' ODA/p-PDA | 150 | 267 | 285 | 70 | 11.0 | 0.76 | N. D. |
| COMPARATIVE EXAMPLE 6 | | 75 | 220 | 263 | 71 | 8.9 | 0.68 | N. D. |
| EXAMPLE 8 | | 75 | 255 | 312 | 68 | 12.1 | 0.82 | 0.005 |
| COMPARATIVE EXAMPLE 7 | PMDA/4,4' ODA | 150 | 325 | 240 | 99 | 11.1 | 0.78 | N. D. |
| COMPARATIVE EXAMPLE 8 | | 75 | 253 | 222 | 101 | 9.2 | 0.80 | N. D. |
| EXAMPLE 9 | | 75 | 318 | 268 | 100 | 12.9 | 0.83 | 0.008 |

N. D.: NOT DETECTED

It can be seen that the present invention can produce polyimide films with superior mechanical properties and with good productivity.

In the following Examples and Comparative Examples, evaluations of tear propagation strength and tensile strength of the polyimide films were carried out according to ASTM D-1938 and JIS C-2318, respectively. The adhesion strength was evaluated using a trilayer copper-clad laminate which was prepared by laminating an electrolytic copper foil (Mitsui Mining 86 Smelting Co.; product name 3ECVLP; thickness 35 μm) and the polyimide film, wherein the evaluation was carried out at a 90° peel and a copper pattern width of 3 mm, according to JIS C-6481.

The amount of remaining catalyst and the amount of main solvent in the gel film were decided by gas chromatography analysis of a liquid that was prepared by dipping the gel film in N-methyl-2-pyrrolidone for 48 hours. The calculation did not take into account the moisture content of the remaining volatile component and the calculation quantified the acetic acid anhydride as the quantity of acetic acid that was generated by hydrolysis of the gel film dipped in the N-methyl-2-pyrrolidone.

Comparative Example 9

Polyamic acid was synthesized from a 4:3:1 mole ratio of pyromellitic dianhydride, 4,4'-diaminodiphenylether, and p-phenylenediamine. 100 g of a DMF solution containing 18.5 wt % of the polyamic acid was prepared and then mixed with a converting agent containing 38 g of acetic anhydride, 4.5 g of isoquinoline, and 15 g of DMF. The mixture was stirred, defoamed by centrifugation, and coated by casting on an aluminum foil. The laminate of aluminum foil and polyamic acid solution was then heated at 120° C. for 150 seconds to obtain a self-supporting gel film. The content of remaining volatile component of the gel film was 40 wt %. The remaining volatile component contained 39 wt % DMF, 51 wt % isoquinoline, and 10 wt % acetic acid. The gel film was then detached from the aluminum foil and anchored on a frame. The gel film was heated at 300° C., 400° C., and 500° C. for 30 seconds each, so as to produce a polyimide film with a thickness of 25 μm. Table 3 shows basic mechanical properties of this polyimide film.

Comparative Example 10

A polyimide film with a thickness of 25 μm was produced in exactly the same manner as in the Comparative Example 9, except that the laminate of aluminum foil and polyamic acid solution was heated at 160° C. for 75 seconds. The content of remaining volatile component in the gel film in an intermediate stage was 39 wt % and the remaining volatile component contained 38 wt % DMF, 45 wt % isoquinoline, and 17 wt % acetic acid. Table 3 shows basic mechanical properties of this polyimide film.

Example 10

A polyimide film with a thickness of 25 μm was produced in exactly the same manner as in the Comparative Example 9, except that a converting agent containing 20 g acetic anhydride, 10 g isoquinoline, and 30 g DMF were used and the laminate of aluminum foil and polyamic acid solution was heated at 160° C. for 75 seconds. The content of remaining volatile component in the gel film in an intermediate stage was 44 wt % and the remaining volatile component contained 17 wt % DMF, 75 wt % isoquinoline, and 8 wt % acetic acid. Table 3 shows basic mechanical properties of this polyimide film.

Comparative Example 11

A polyimide film with a thickness of 25 μm was produced in exactly the same manner as in the Comparative Example 9, except that a 1:1 mole ratio of pyromellitic dianhydride and 4,4'-diaminodiphenylether were used. The content of remaining volatile component in the gel film in an intermediate stage was 35 wt %. The remaining volatile component contained 37 wt % DMF, 56 wt % isoquinoline, and 7 wt % acetic acid. Table 3 shows basic mechanical properties of the polyimide film.

Comparative Example 12

A polyimide film with a thickness of 25 μm was produced in exactly the same manner as in the Comparative Example 9, except that the laminate of aluminum foil and polyamic acid solution was heated at 160° C. for 75 seconds. The content of remaining volatile component in the gel film in the intermediate stage was 38 wt % and the remaining volatile component contained 36 wt % DMF, 43 wt % isoquinoline, and 21 wt % acetic acid. Table 3 shows basic mechanical properties of this polyimide film.

Example 11

A polyimide film with a thickness of 25 μm was produced in exactly the same manner as in the Comparative Example 3, except that an additive containing 20 g acetic anhydride, 10 g isoquinoline, and 30 g DMF were used and the laminate of aluminum foil and polyamic acid solution was heated at 160° C. for 75 seconds. The content of remaining volatile component in the gel film in the intermediate stage was 50 wt % and the remaining volatile component contained 18 wt % DMF, 72 wt % isoquinoline, and 10 wt % acetic acid. Table 3 shows basic mechanical properties of this polyimide film.

Comparative Example 14

Polyamic acid was synthesized from a 4:3:1 mole ratio of pyromellitic dianhydride, 4,4'-diaminodiphenylether, and p-phenylenediamine. A DMF solution containing 18.5 wt % of the polyamic acid was prepared and mixed with 60 wt % of a curing agent containing 764 g of acetic anhydride, 97 g

TABLE 3

| | POLYIMIDE STRUCTURE | PRODUCTION TIME OF GEL FILM (SEC.) | TEAR PROPAGATION STRENGTH (g/mm) | TENSILE STRENGTH (kg/mm$^2$) | ELONGATION (%) | ADHESION STRENGTH (N/cm) | WEIGHT LOSS (wt %) | AMOUNT OF REMAINING CATALYST (wt %) |
|---|---|---|---|---|---|---|---|---|
| COMPARATIVE EXAMPLE 9 | PMDA/4,4' ODA/p-PDA | 150 | 265 | 283 | 71 | 11.3 | 0.75 | N. D. |
| COMPARATIVE EXAMPLE 10 | | 75 | 235 | 263 | 71 | 8.9 | 0.68 | N. D. |
| EXAMPLE 10 | | 75 | 268 | 307 | 69 | 11.8 | 0.83 | 0.11 |
| COMPARATIVE EXAMPLE 11 | PMDA/4,4' ODA | 150 | 325 | 240 | 99 | 11.1 | 0.79 | N. D. |
| COMPARATIVE EXAMPLE 12 | | 75 | 265 | 225 | 100 | 9.2 | 0.81 | N. D. |
| EXAMPLE 11 | | 75 | 318 | 268 | 102 | 12.1 | 0.82 | 0.12 |

N. D.: NOT DETECTED

It can be seen that the present invention can produce polyimide films with superior mechanical properties and with good productivity.

In the following Examples and Comparative Examples, "parts" are "parts by weight", and "%" is percent by weight.

(Method of Evaluation)

1) Measurements of Tensile Strength

Measurements were carried out according to ASTM D882.

2) Measurements of R Value in MD Direction

A central portion of the product polyimide film was sampled for 5 m in the MD direction. A continuous pachymeter of a contact type was used to continuously measure thickness. A maximum thickness and a minimum thickness were taken out of a chart.

R value was determined as follows (the unit is in microns):

$$R\text{ value} = [\text{maximum thickness}] - [\text{minimum thickness}]$$

Comparative Example 13

Polyamic acid was synthesized from a 4:3:1 mole ratio of pyromellitic dianhydride, 4,4'-diaminodiphenylether, and p-phenylenediamine. A DMF solution containing 18.5 wt % of the polyamic acid was prepared and mixed with 40 wt % of a curing agent containing 573 g of acetic anhydride, 73 g of isoquinoline, and 154 g of DMF. The mixture was quickly stirred in a mixer and extruded from a T die to be cast on a stainless-steel endless belt traveling 25 mm below the die at a speed of 12 m/minute. The viscosity of a resin solution in the T die was 750 poise at 0° C. The acetic anhydride as the dehydrating agent and the isoquinoline as the catalyst were used in mole ratios of 3 and 0.3, respectively, with respect to 1 mole of amic acid in the polyamic acid varnish. The resin film was dried and imidized for 130° C.×100 seconds, 300° C.×20 seconds, 450° C.×20 seconds, and 500° C.×20 seconds, so as to obtain a polyimide film with a thickness of 25 μm. Table 4 shows properties of this polyimide film. Examining the film showed trapping of countless bubbles of about a 5 mm diameter at the both ends of the film.

of isoquinoline, and 336 g of DMF. The mixture was quickly stirred in a mixer and extruded from a T die to be cast on a stainless-steel endless belt traveling 25 mm below the die at a speed of 16 m/minute. The viscosity of a resin solution in the T die was 460 poise at 0° C. The acetic anhydride as the dehydrating agent and the isoquinoline as the catalyst were used in mole ratios of 4 and 0.4, respectively, with respect to 1 mole of amic acid in the polyamic acid varnish. The resin film was dried and imidized for 140° C.×100 seconds, 300° C.×20 seconds, 450° C.×20 seconds, and 500° C.×20 seconds, so as to obtain a polyimide film with a thickness of 25 μm. Table 4 shows properties of this polyimide film. Examining the film showed trapping of countless bubbles of about a 5 mm diameter at the both ends of the film.

Comparative Example 15

Polyamic acid was synthesized from a 1:1 mole ratio of pyromellitic dianhydride and 4,4'-diaminodiphenylether. A DMF solution containing 18.5 wt % of the polyamic acid was prepared and mixed with 40 wt % of a curing agent containing 632 g of acetic anhydride, 80 g of isoquinoline, and 88 g of DMF. The mixture was quickly stirred in a mixer and extruded from a T die to be cast on a stainless-steel endless belt traveling 25 mm below the die at a speed of 12 m/minute. The viscosity of a resin solution in the T die was 790 poise at 0° C. The acetic anhydride as the dehydrating agent and the isoquinoline as the catalyst were used in mole ratios of 3.5 and 0.35, respectively, with respect to 1 mole amic acid in the polyamic acid varnish. The resin film was dried and imidized for 130° C.×100 seconds, 300° C.×20 seconds, 450° C.×20 seconds, and 500° C.×20 seconds, so as to obtain a polyimide film with a thickness of 25 μm. Table 4 shows properties of this polyimide film. Examining the film showed trapping of countless bubbles of about a 5 mm diameter at the both ends of the film.

Comparative Example 16

Polyamic acid was synthesized from a 1:1 mole ratio of pyromellitic dianhydride and 4,4'-diaminodiphenylether. A DMF solution containing 18.5 wt % of the polyamic acid was prepared and mixed with 60 wt % of a curing agent containing 813 g of acetic anhydride, 103 g of isoquinoline, and 285 g of DMF. The mixture was quickly stirred in a mixer and extruded from a T die to be cast on a stainless-steel endless belt traveling 25 mm below the die at a speed of 16 m/minute. The viscosity of a resin solution in the T die was 480 poise at 0° C. The acetic anhydride as the dehydrating agent and the isoquinoline as the catalyst were used in mole ratios of 4.5 and 0.45, respectively, with respect to 1 mole of amic acid in the polyamic acid varnish. The resin film was dried and imidized for 140° C.×100 seconds, 300° C.×20 seconds, 450° C.×20 seconds, and 500° C.×20 seconds, so as to obtain a polyimide film with a thickness of 25 µm. Table 4 shows properties of this polyimide film. Examining the film showed trapping of countless bubbles of about a 5 mm diameter at the both ends of the film.

Example 12

Polyamic acid was synthesized from a 4:3:1 mole ratio of pyromellitic dianhydride, 4,4'-diaminodiphenylether, and p-phenylenediamine. A DMF solution containing 18.5 wt % of the polyamic acid was prepared and mixed with 40 wt % of a curing agent containing 382 g of acetic anhydride, 97 g of isoquinoline, and 318 g of DMF. The mixture was quickly stirred in a mixer and extruded from a T die to be cast on a stainless-steel endless belt traveling 25 mm below the die at a speed of 12 m/minute. The viscosity of a resin solution in the T die was 520 poise at 0° C. The acetic anhydride as the dehydrating agent and the isoquinoline as the catalyst were used in mole ratios of 2.0 and 0.4, respectively, with respect to 1 mole amic acid in the polyamic acid varnish. The resin film was dried and imidized for 130° C.×100 seconds, 300° C.×20 seconds, 450° C.×20 seconds, and 500° C.×20 seconds, so as to obtain a polyimide film with a thickness of 25 µm. Table 4 shows properties of this polyimide film.

Example 13

Polyamic acid was synthesized from a 4:3:1 mole ratio of pyromellitic dianhydride, 4, 4'-diaminodiphenylether, and p-phenylenediamine. A DMF solution containing 18.5 wt % of the polyamic acid was prepared and mixed with 40 wt % of a curing agent containing 382 g of acetic acid anhydride, 169 g of isoquinoline, and 249 g of DMF. The mixture was quickly stirred in a mixer and extruded from a T die to be cast on a stainless-steel endless belt traveling 25 mm below the die at a speed of 16 m/minute. The viscosity of a resin solution in the T die was 320 poise at 0° C. The acetic anhydride as the dehydrating agent and the isoquinoline as the catalyst were used in mole ratios of 2.0 and 0.7, respectively, with respect to 1 mole amic acid in the polyamic acid varnish. The resin film was dried and imidized for 140° C.×100 seconds, 300° C.×20 seconds, 450° C.×20 seconds, and 500° C.×20 seconds, so as to obtain a polyimide film with a thickness of 25 µm. Table 4 shows properties of this polyimide film.

Example 14

Polyamic acid was synthesized from a 1:1 mole ratio of pyromellitic dianhydride and 4,4'-diaminodiphenylether. A DMF solution containing 18.5 wt % of the polyamic acid was prepared and mixed with 40 wt % of a curing agent containing 361 g of acetic anhydride, 103 g of isoquinoline, and 336 g of DMF. The mixture was quickly stirred in a mixer and extruded from a T die to be cast on a stainless-steel endless belt traveling 25 mm below the die at a speed of 12 m/minute. The viscosity of a resin solution in the T die was 580 poise at 0° C. The acetic anhydride as the dehydrating agent and the isoquinoline as the catalyst were used in mole ratios of 2.0 and 0.45, respectively, with respect to 1 mole of amic acid in the polyamic acid varnish. The resin film was dried and imidized for 130° C.×100 seconds, 300° C.×20 seconds, 450° C.×20 seconds, and 500° C.×20 seconds, so as to obtain a polyimide film with a thickness of 25 µm. Table 4 shows properties of this polyimide film.

Example 15

Polyamic acid was synthesized from a 1:1 mole ratio of pyromellitic dianhydride and 4, 4'-diaminodiphenylether. A DMF solution containing 18.5 wt % of the polyamic acid was prepared and mixed with 40 wt % of a curing agent containing 271 g of acetic anhydride, 228 g of isoquinoline, and 301 g of DMF. The mixture was quickly stirred in a mixer and extruded from a T die to be cast on a stainless-steel endless belt traveling 25 mm below the die at a speed of 16 m/minute. The viscosity of a resin solution in the T die was 360 poise at 0° C. The acetic anhydride as the dehydrating agent and the isoquinoline as the catalyst were used in mole ratios of 1.5 and 1.0 with respect to 1 mole of amic acid in the polyamic acid varnish. The resin film was dried and imidized for 140° C.×100 seconds, 300° C.×20 seconds, 450° C.×20 seconds, and 500° C.×20 seconds, so as to obtain a polyimide film with a thickness of 25 µm. Table 4 shows properties of this polyimide film.

TABLE 4

|  | POLYIMIDE STRUCTURE | DEHYDRATING AGENT/CATALYST (MOLE RATIO) | TENSILE STRENGTH (kg/mm$^2$) | ELONGATION (%) | THICKNESS UNEVENNESS (µm) | AIR TRAPPING |
|---|---|---|---|---|---|---|
| COMPARATIVE EXAMPLE 13 | PMDA/4,4' ODA/p-PDA | 1/0.1 | 307 | 70 | 2.8 | PRESENT |
| COMPARATIVE EXAMPLE 14 |  |  | 285 | 71 | 3.3 | PRESENT |
| COMPARATIVE EXAMPLE 15 | PMDA/4,4' ODA |  | 260 | 105 | 3.0 | PRESENT |
| COMPARATIVE EXAMPLE 16 |  |  | 223 | 106 | 3.5 | PRESENT |
| EXAMPLE 12 | PMDA/4,4' | 1/0.2 | 310 | 72 | 1.5 | ABSENT |
| EXAMPLE 13 | ODA/p-PDA | 1/0.35 | 313 | 75 | 1.8 | ABSENT |
| EXAMPLE 14 | PMDA/4,4' | 1/0.23 | 265 | 110 | 1.6 | ABSENT |
| EXAMPLE 15 | ODA | 1/0.67 | 270 | 108 | 1.9 | ABSENT |

According to the present invention, the composition of the curing agent is adjusted so as to lower viscosity of the solution in the extruding die. This prevents trapping of bubbles during the high-speed deposition process. In addition, the thickness does not become uneven in the MD direction. As a result, the polyimide film with superior mechanical properties can be produced.

In the following Examples and Comparative Examples, measurements were carried out as follows.

(Method of Evaluation)

1) Measurement of Tensile Strength

The measurements were carried out according to ASTM D882.

2) Measurement of Tear Propagation Strength

The measurements were carried out according to ASTM D-1938.

3) Measurement of a Ratio of Maximum Value to Minimum Value of Tear Propagation Strength Samples were collected at 10 cm intervals in the transverse direction of the film. The samples were measured to obtain the maximum value and minimum value of tear propagation strength. The maximum value and minimum value were used to calculate a ratio (maximum value/minimum value).

4) R Value of Tear Propagation Strength

The difference of maximum value and minimum value of the measured samples was used for the evaluation (FIG. 1).

Note that, a location of the film 10 mm inside the portion of the film fastened with pins or clips will be called an outermost portion of the film.

5) Adhesion Strength

The adhesion strength was evaluated using a trilayer copper-clad laminate, which was prepared by laminating an electrolytic copper foil (Mitsui Mining 86 Smelting Co., Ltd.; product name 3ECVLP; thickness 35 μm) and the polyimide film using a nylon-epoxy adhesive, wherein the evaluation was carried out at a 90° peel and a copper pattern width of 3 mm, according to JIS C-6481.

The heating conditions of the film were the same throughout the Examples and Comparative Examples.

Example 16

Polyamic acid was synthesized from a 4:3:1 mole ratio of pyromellitic dianhydride, 4,4'-diaminodiphenylether, and p-phenylenediamine. 100 parts of a DMF solution containing 18.5 wt % of the polyamic acid was prepared and mixed with 50 parts of a curing agent containing 38 parts of acetic anhydride, 10 parts of isoquinoline, and 52 parts of DMF. The mixture was quickly stirred in a mixer and extruded from a T die to be cast on a stainless-steel endless belt traveling 20 mm below the die. The acetic anhydride as the dehydrating agent and the isoquinoline as the catalyst were used in mole ratios of 2.0 and 0.4, respectively, with respect to 1 mole of amic acid in the polyamic acid varnish. The resin film, after heated for 130° C.×100 seconds, was separated from the support and dried and imidized with its end portions fastened with pins for 300° C.×20 seconds, 450° C.×20 seconds, and 500° C.×20 seconds, so as to obtain a polyimide film with a thickness of 25 μm and a width of 1500 mm. Table 5 shows properties of this polyimide film.

Example 17

Polyamic acid was synthesized from a 4:3:1 mole ratio of pyromellitic dianhydride, 4,4'-diaminodiphenylether, and p-phenylenediamine. 100 parts of a DMF solution containing 18.5 wt % of the polyamic acid was prepared and mixed with 50 parts of a curing agent containing 38 parts of acetic anhydride, 19 parts of isoquinoline, and 43 parts of DMF. The mixture was quickly stirred in a mixer and extruded from a T die to be cast on a stainless-steel endless belt traveling 20 mm below the die. The acetic anhydride as the dehydrating agent and the isoquinoline as the catalyst were used in mole ratios of 2.0 and 0.8, respectively, with respect to 1 mole of amic acid in the polyamic acid varnish. The resin film, after heated for 130° C.×100 seconds, was separated from the support and dried and imidized with its end portions fastened for 300° C.×20 seconds, 450° C.×20 seconds, and 500° C.×20 seconds, so as to obtain a polyimide film with a thickness of 25 μm and a width of 1500 mm. Table 5 shows properties of this polyimide film.

Example 18

Polyamic acid was synthesized from a 1:1 mole ratio of pyromellitic dianhydride and 4,4'-diaminodiphenylether. 100 parts of a DMF solution containing 18.5 wt % of the polyamic acid was prepared and mixed with 65 parts of a curing agent containing 28 parts of acetic anhydride, 14 parts of isoquinoline, and 58 parts of DMF. The mixture was quickly stirred in a mixer and extruded from a T die to be cast on a stainless-steel endless belt traveling 20 mm below the die. The acetic anhydride as the dehydrating agent and the isoquinoline as the catalyst were used in mole ratios of 2.0 and 0.8, respectively, with respect to 1 mole of amic acid in the polyamic acid varnish. The resin film, after heated for 130° C.×100 seconds, was separated from the support and dried and imidized with its end portions fastened with pins for 300° C.×20 seconds, 450° C.×20 seconds, and 500° C.×20 seconds, so as to obtain a polyimide film with a thickness of 25 μm and a width of 1500 mm. Table 5 shows properties of this polyimide film.

Comparative Example 17

Polyamic acid was synthesized from a 4:3:1 mole ratio of pyromellitic dianhydride, 4,4'-diaminodiphenylether, and p-phenylenediamine. 100 parts of a DMF solution containing 18.5 wt % of the polyamic acid was prepared and mixed with 50 parts of a curing agent containing 67 parts of acetic anhydride, 8 parts of isoquinoline, and 25 parts of DMF. The mixture was quickly stirred in a mixer and extruded from a T die to be cast on a stainless-steel endless belt traveling 20 mm below the die. The acetic anhydride as the dehydrating agent and the isoquinoline as the catalyst were used in mole ratios of 3.5 and 0.35, respectively, with respect to 1 mole of amic acid in the polyamic acid varnish. The resin film, after heated for 130° C.×100 seconds, was separated from the support and dried and imidized with its end portions fastened with pins for 300° C.×20 seconds, 450° C.×20 seconds, and 500° C.×20 seconds, so as to obtain a polyimide film with a thickness of 25 μm and a width of 1500 mm. Table 5 shows properties of this polyimide film.

Comparative Example 18

Polyamic acid was synthesized from a 1:1 mole ratio of pyromellitic dianhydride and 4,4'-diaminodiphenylether. 100 parts of a DMF solution containing 18.5 wt % of the polyamic acid was prepared and mixed with 50 parts of a curing agent containing 36 parts of acetic acid anhydride, 5 parts of isoquinoline, and 59 parts of DMF. The mixture was quickly stirred in a mixer and extruded from a T die to be cast on a stainless-steel endless belt traveling 20 mm below the die. The acetic anhydride as the dehydrating agent and the isoquinoline as the catalyst were used in mole ratios of 2.0 and 0.2, respectively, with respect to 1 mole of amic acid in the polyamic acid varnish. The resin film was then heated for 130° C.×100 seconds. After the heating, an attempt to separate the resin film from the support failed.

750 mm from the central portion. The molecular orientation MOR-c was measured using the microwave molecular orientation measurement instrument MOA2012A of KS Systems Inc. Note that, the MOR value given by this measurement instrument is a measure of anisotropy of molecular orientation in a film plane. The MOR value, however, is proportional to the thickness and therefore was converted to

TABLE 5

| | TEAR PROPAGATION STRENGTH (g) | | | | TENSILE CHARACTERISTICS | | ADHESION |
|---|---|---|---|---|---|---|---|
| | MAXIMUM VALUE | MINIMUM VALUE | R VALUE OF OUTERMOST PORTION | | MODULUS (GPa) | ELONGATION (%) | STRENGTH (N/cm) |
| EXAMPLE 16 | 7.15 | 6.47 | 0.21 | CENTRAL PORTION | 4.22 | 80 | 11.3 |
| | | | | OUTERMOST PORTION | 4.16 | 89 | 11.5 |
| EXAMPLE 17 | 7.31 | 6.53 | 0.15 | CENTRAL PORTION | 4.21 | 78 | 11.8 |
| | | | | OUTERMOST PORTION | 4.18 | 84 | 11.5 |
| EXAMPLE 18 | 8.21 | 7.74 | 0.22 | CENTRAL PORTION | 3.31 | 129 | 10.5 |
| | | | | OUTERMOST PORTION | 3.20 | 136 | 10.8 |
| COMPARATIVE EXAMPLE 17 | 8.80 | 6.53 | 1.33 | CENTRAL PORTION | 4.13 | 82 | 12.2 |
| | | | | OUTERMOST PORTION | 4.38 | 99 | 8.36 |

According to the present invention, the composition of the curing agent is adjusted. In this way, the mechanical strengths and adhesion strength in the direction of width become less variant during the continuous deposition process.

Example 19

Polyamic acid was synthesized from a 4:3:1 mole ratio of pyromellitic dianhydride, 4,4'-diaminodiphenylether, and p-phenylenediamine. A DMF solution containing 18.5 wt % of the polyamic acid was prepared and mixed and stirred with 50 wt % of a curing agent containing acetic anhydride, isoquinoline, and DMF. The mixture was adjusted so that the acetic anhydride and isoquinoline were 2.0 mole equivalent and 0.4 mole equivalent, respectively, with respect to the amic acid group of the polyamic acid. The mixture was then cast through a T slit die onto a rotary stainless-steel endless belt, and the resin film so cast was heated in hot air at 150° C. As a result, a self-supporting gel film with a 55 wt % remaining volatile component and a thickness of about 0.20 mm was obtained. The gel film was then detached from the endless belt and, with its end portions fastened on a tenter frame, conveyed to a heating furnace maintained at 220° C., 370° C., and 550° C. Slitting the end portions produced a polyimide film with a width of 1500 mm and a thickness of 25 μm. The polyimide film was evaluated for molecular orientation MOR-c, modulus, and tensile strength as follows. The results are shown in Table 6.

(Molecular Orientation MOR-c)

Portions of the product film, 1500 mm wide, were cut out to obtain samples of 40 mm×40 mm each. Namely, samples were obtained from the central portion, from portions 375 mm from the central portion, and from the end portions, i.e., a value at a thickness of 75 μm according to the equation below. The film becomes more isotropic as the MOR-c approaches 1.0.

$$MOR\text{-}c = 1 + (MOR-1) \times t/75$$

where MOR is the molecular orientation before conversion, and t is the thickness of a target (μm).

Figure 2:
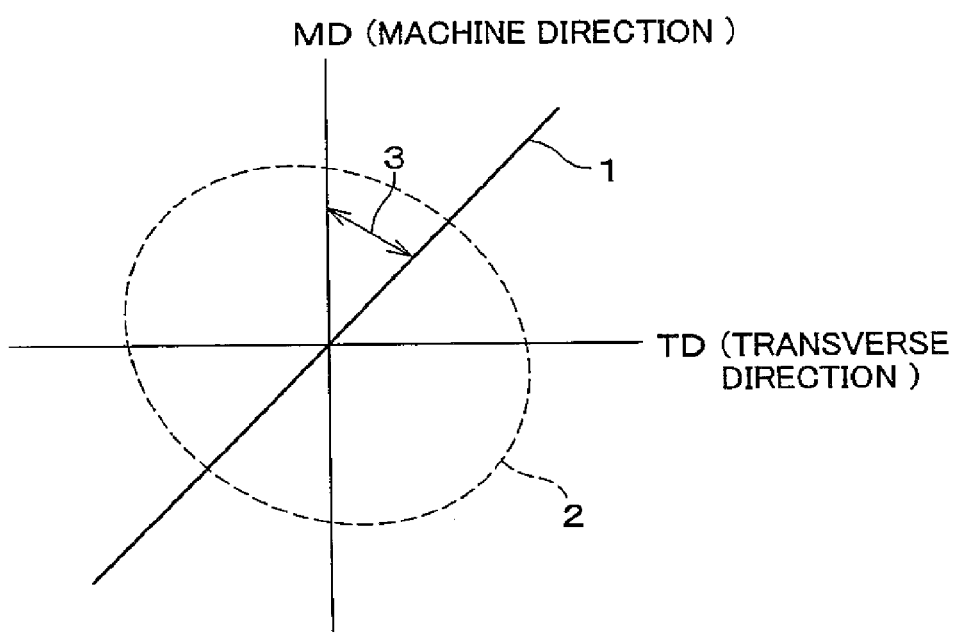
FIG. 2 is a drawing showing a microwave transmission curve and a principal axis of orientation, which are obtained by a molecular orientation measurement instrument.

The measurement device used herein measures microwave transmission intensity by rotating a sample that has been inserted into a microwave resonance waveguide with its measured film plane being perpendicular to the machine direction of the microwave. FIG. 2 conceptually shows a resulting transmission intensity curve, where a direction which gives the minimum transmission intensity is the principal axis of orientation. The modulus and coefficient of thermal expansion were measured as follows with respect to directions parallel to and perpendicular to the principal axis of orientation. Note that, indicated by the reference sign 1 is the principal axis of molecular orientation, 2 the microwave transmission intensity curve, and 3 the orientation angle.

(Modulus)

The modulus and tensile strength were measured according to JIS C-2318 with respect to a total of 5 locations on the 1500 mm wide film, at the central portion, portions 375 mm from the central portion, and the end portions, i.e., portions 750 mm from the central portion. Note that, the measurement was taken by cutting out the samples in directions parallel to and perpendicular to the principal axes of orientation that was obtained from the molecular orientation measurement instrument.

(Coefficient of Thermal Expansion)

The coefficient of thermal expansion was measured with respect to a total of 5 locations on the 1500 mm wide film, at the central portion, portion 375 mm from the central portion, and the end portion, i.e., portions 750 mm from the central portion, using the thermophysical testing instrument TMA-8140 of Rigaku. The film at room temperature was heated to 400° C. at 10° C./minute and then cooled back to room temperature. The same heating was carried out again to obtain coefficient of thermal expansion in a temperature range of 100° C. to 200° C.

Comparative Example 19

A gel film with a 45 wt % remaining volatile component and a thickness of about 0.20 mm was obtained as in Example 19, except that the mixture was adjusted to have 5.5 mole equivalent and 2.0 mole equivalent of acetic anhydride and isoquinoline, respectively, with respect to the amic acid group of the polyamic acid. Then, the gel film was detached from the endless belt and, with its end portions fastened on a tenter frame, conveyed to a heating furnace maintained at 200° C., 350° C., and 550° C. Slitting the end portions produced a polyimide film with a width of 1500 mm and a thickness of 25 µm. Table 6 shows the molecular orientation MOR-c, modulus, tensile strength, and coefficient of thermal expansion of the polyimide film.

Comparative Example 20

A polyimide film with a width of 1500 mm and a thickness of 25 µm was obtained as in Example 19, except that the gel film was conveyed to a heating furnace maintained at 300° C., 450° C., and 550° C. for heating. Table shows the molecular orientation MOR-c, modulus, tensile strength, and coefficient of thermal expansion of the polyimide film.

Example 20

Polyamic acid was synthesized from a 4:3:1 mole ratio of pyromellitic dianhydride, 4,4'-diaminodiphenylether, and p-phenylenediamine. A DMF solution containing 18.5 wt % of the polyamic acid was prepared and mixed and stirred with 50 wt % of a converting agent containing acetic anhydride, isoquinoline, and DMF. The mixture was adjusted so that the acetic anhydride and isoquinoline were 2.0 mole equivalent and 0.4 mole equivalent, respectively, with respect to the amic acid unit of the polyamic acid. The mixture was then cast through a T slit die onto a rotary stainless-steel endless belt, and the resin film so cast was heated in hot air at 150° C. As a result, a self-supporting gel film with a 50 wt % remaining volatile component and a thickness of about 0.10 mm was obtained. The gel film was then detached from the endless belt and, with its end portions fastened on a tenter frame, conveyed to a heating furnace maintained at 200° C., 350° C., and 550° C. Slitting the end portions produced a polyimide film with a width of 1500 mm and a thickness of 12.5 µm. Table 7 shows the molecular orientation MOR-c, modulus, tensile strength, and coefficient of thermal expansion of the polyimide film.

Comparative Example 21

A gel film with a 45 wt % remaining volatile component and a thickness of about 0.10 mm was obtained as in Example 19, except that the mixture was adjusted to have 5.5 mole equivalent and 2.0 mole equivalent of acetic anhydride and isoquinoline, respectively, with respect to the amic acid group of the polyamic acid. Then, the gel film was detached from the endless belt and, with its end portions fastened on a tenter frame, conveyed to a heating furnace maintained at 200° C., 350° C., and 550° C. Slitting the end portions produced a polyimide film with a width of 1500 mm and a thickness of 25 µm. Table 7 shows the molecular orientation MOR-c, modulus, tensile strength, and coefficient of thermal expansion of the polyimide film.

Comparative Example 22

A polyimide film with a width of 1500 mm and a thickness of 12.5 µm was obtained as in Example 19, except that the gel film was conveyed to a heating furnace maintained at 300° C., 450° C., and 550° C. for heating. Table shows the molecular orientation MOR-c, modulus, tensile strength, and coefficient of thermal expansion of the polyimide film.

It can be seen from Table 6 and Table 7 that an isotropic film with an extremely small variance of properties in the direction of the principal axis of orientation and the direction perpendicular to the principal axis can be obtained when the molecular orientation MOR-c is not more than 1.30 or not more than 1.20 in any part of the film in the transverse direction.

TABLE 6

| | | POSITIONS FROM THE CENTER | | | | | | | | |
|---|---|---|---|---|---|---|---|---|---|---|
| | | 750 mm | | 375 mm | | 0 mm | | 375 mm | | 750 mm | |
| EXAMPLE 19 | MOR-c VALUE | 1.20 | | 1.12 | | 1.05 | | 1.13 | | 1.13 | |
| | MODULUS (GPa) | 4.2 | 4.1 | 4.2 | 4.2 | 4.2 | 4.2 | 4.1 | 4.0 | 4.2 | 4.1 |
| | TENSILE STRENGTH (MPa) | 311 | 308 | 304 | 300 | 305 | 301 | 300 | 298 | 310 | 290 |
| | COEFFICIENT OF THERMAL EXPANSION (ppm) | 15 | 16 | 15 | 16 | 16 | 16 | 15 | 16 | 15 | 16 |
| COMPARATIVE EXAMPLE 19 | MOR-c VALUE | 1.40 | | 1.20 | | 1.03 | | 1.22 | | 1.35 | |
| | MODULUS (GPa) | 4.7 | 3.6 | 4.3 | 3.9 | 4.1 | 4.0 | 4.3 | 3.9 | 4.6 | 3.7 |
| | TENSILE STRENGTH (MPa) | 343 | 281 | 315 | 298 | 305 | 301 | 310 | 290 | 340 | 275 |
| | COEFFICIENT OF THERMAL EXPANSION (ppm) | 13 | 18 | 15 | 18 | 16 | 16 | 15 | 17 | 13 | 19 |

TABLE 6-continued

| | | POSITIONS FROM THE CENTER | | | | | | | | | |
|---|---|---|---|---|---|---|---|---|---|---|---|
| | | 750 mm | | 375 mm | | 0 mm | | 375 mm | | 750 mm | |
| COMPARATIVE EXAMPLE 20 | MOR-c VALUE | 1.48 | | 1.29 | | 1.11 | | 1.28 | | 1.43 | |
| | MODULUS (GPa) | 4.6 | 3.5 | 4.4 | 3.8 | 4.1 | 3.9 | 4.2 | 3.8 | 4.5 | 3.6 |
| | TENSILE STRENGTH (MPa) | 351 | 288 | 318 | 295 | 310 | 300 | 309 | 289 | 340 | 271 |
| | COEFFICIENT OF THERMAL EXPANSION (ppm) | 13 | 20 | 15 | 18 | 16 | 17 | 14 | 18 | 13 | 19 |

(LEFT COLUMN: DIRECTION OF PRINCIPLE AXIS OF ORIENTATION; RIGHT COLUMN: DIRECTION PERPENDICULAR TO PRINCIPLE AXIS OF ORIENTATION)

TABLE 7

| | | POSITIONS FROM THE CENTER | | | | | | | | | |
|---|---|---|---|---|---|---|---|---|---|---|---|
| | | 750 mm | | 375 mm | | 0 mm | | 375 mm | | 750 mm | |
| EXAMPLE 20 | MOR-c VALUE | 1.18 | | 1.15 | | 1.10 | | 1.13 | | 1.15 | |
| | MODULUS (GPa) | 4.3 | 4.2 | 4.2 | 4.2 | 4.3 | 4.2 | 4.2 | 4.2 | 4.3 | 4.2 |
| | TENSILE STRENGTH (MPa) | 320 | 305 | 315 | 311 | 307 | 305 | 309 | 306 | 316 | 304 |
| | COEFFICIENT OF THERMAL EXPANSION (ppm) | 15 | 16 | 16 | 16 | 16 | 16 | 15 | 16 | 15 | 16 |
| COMPARATIVE EXAMPLE 21 | MOR-c VALUE | 1.46 | | 1.19 | | 1.02 | | 1.15 | | 1.40 | |
| | MODULUS (GPa) | 4.8 | 3.5 | 4.4 | 4.0 | 4.3 | 4.3 | 4.3 | 4.1 | 4.7 | 3.7 |
| | TENSILE STRENGTH (MPa) | 350 | 293 | 327 | 300 | 310 | 310 | 312 | 310 | 344 | 299 |
| | COEFFICIENT OF THERMAL EXPANSION (ppm) | 12 | 19 | 13 | 17 | 16 | 16 | 13 | 17 | 13 | 19 |
| COMPARATIVE EXAMPLE 22 | MOR-c VALUE | 1.50 | | 1.25 | | 1.15 | | 1.28 | | 1.43 | |
| | MODULUS (GPa) | 4.6 | 3.5 | 4.4 | 3.8 | 4.1 | 3.9 | 4.2 | 3.8 | 4.5 | 3.6 |
| | TENSILE STRENGTH (MPa) | 351 | 288 | 318 | 295 | 310 | 300 | 309 | 289 | 340 | 271 |
| | COEFFICIENT OF THERMAL EXPANSION (ppm) | 13 | 20 | 15 | 18 | 16 | 17 | 14 | 18 | 13 | 19 |

(LEFT COLUMN: DIRECTION OF PRINCIPLE AXIS OF ORIENTATION; RIGHT COLUMN: DIRECTION PERPENDICULAR TO PRINCIPLE AXIS OF ORIENTATION)

With the present invention, an isotropic film with extremely small differences of mechanical properties between any points of the film can be obtained. The film can be obtained with an improved in-plane isotropy particularly at the end portions. The film can be suitably put to applications where precise dimension accuracy is required, such as in flexible printed circuit boards, TAB carrier tapes, or cover lay films for flexible printed circuit boards.

In the following Examples and Comparative Examples, the modulus and tensile strength of polyimide films were measured according to JIS C-2318.

The coefficient of thermal expansion was measured using the thermophysical testing instrument TMA-8140 of Rigaku. The film at room temperature was heated to 400° C. at 10° C./minute and then cooled back to room temperature. The same heating was carried out again to obtain coefficient of thermal expansion in a temperature range of 100° C. to 200° C.

As the term is used herein, "birefringence" is the difference of refractive indices between an arbitrary direction in the film plane and the direction of thickness, which is given as follows.

Birefringence $\Delta n$=(refractive index $Nx$ in an in-plane direction)−(refractive index $Nz$ in the direction of thickness)

Figure 3:
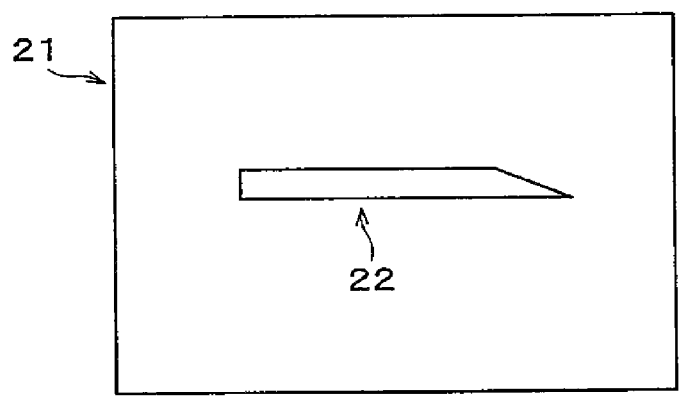
FIG. 3 is a conceptual view of measuring birefringence.
Figure 3:
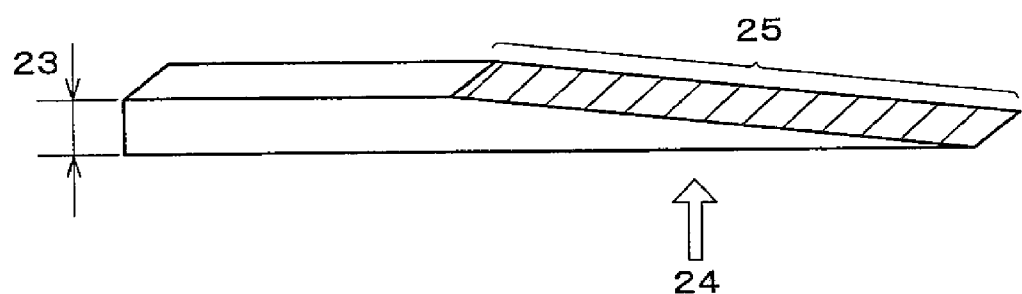
Figure 4:
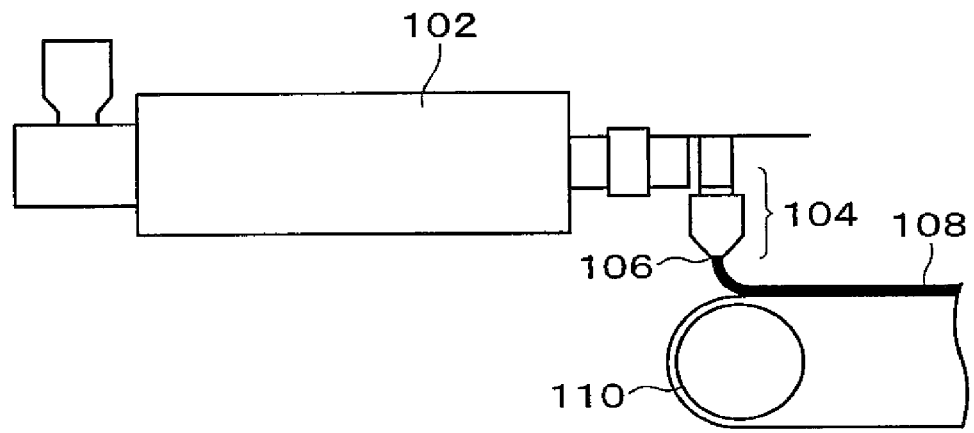
FIG. 4 is a drawing showing a producing process of a polyimide film.
Figure 5:
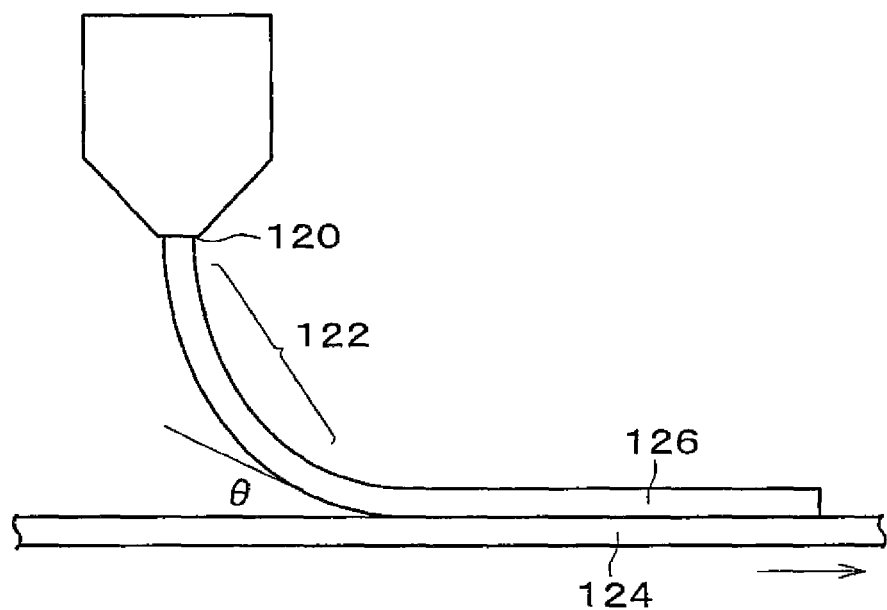
FIG. 5 is a drawing showing how a curtain is extruded from a die lip in a casting method.

FIG. 3 briefly shows a specific example of the measurement method. A portion of a film sample 21 is cut out in the form of a wedge 22. Projecting sodium light 24 in parallel onto the bottom of the wedge, i.e., the film plane, produces interference fringes 25, which can be seen under a polarizing microscope. When the number of interference fringes is n, the birefringence Δn can be expressed as follows.

$$\Delta n = n \times \lambda/d$$

where $\lambda$ is the wavelength of sodium D light at 589 nm, and d is the width (nm) of the sample. Details are explained in *New Lecture on Experimental Chemistry*, Vol. 19 (published by Maruzen Co., Ltd.)

Comparative Example 23

Polyamic acid was synthesized from a 4:3:1 mole ratio of pyromellitic dianhydride, 4,4'-diaminodiphenylether, and p-phenylenediamine. 100 g of a 18.5 wt % N,N-dimethyl-formamide solution of the polyamic acid was mixed and stirred with 35 g of acetic anhydride and 5 g of isoquinoline. After defoamed by centrifugation, the mixture was cast on an aluminum foil to form a resin film of 400 μm. The mixture was stirred and defoamed while cooling to 0° C. The resin film was then heated at 100° C. for 120 seconds and detached from the aluminum foil to obtain a self-supporting gel film. The content of remaining volatile component and percent imidization of the gel film were 160% and 81%, respectively. Thereafter, the gel film, with its end portions fastened on a pin frame, was heated at 150° C., 250° C., 450° C., and 500° C. for 30 seconds at each temperature, so as to produce a polyimide film with a thickness of 25 μm. Table 8 shows properties of the polyimide film.

Comparative Example 24

Polyamic acid was synthesized from a 4:3:1 mole ratio of pyromellitic dianhydride, 4,4'-diaminodiphenylether, and p-phenylenediamine. 100 g of a 18.5 wt % N,N-dimethyl-formamide solution of the polyamic acid was mixed and stirred with 40 g of acetic acid anhydride and 8 g of isoquinoline. After defoaming by centrifugation, the mixture was cast on an aluminum foil to form a resin film of 400 μm. The mixture was stirred and defoamed while cooling to 0° C. The resin film was then heated at 140° C. for 150 seconds and detached from the aluminum foil to obtain a self-supporting gel film. The content of remaining volatile component and percent imidization of the gel film were 35% and 92%, respectively. Thereafter, the gel film, with its end portions fastened on a pin frame, was heated at 350° C., 400° C., 450° C., and 500° C. for 30 seconds at each temperature, so as to produce a polyimide film with a thickness of 25 μm. Table 8 shows properties of the polyimide film.

Example 21

A gel film with a content of remaining volatile component 160% and percent imidization 81% was obtained in the exactly the same manner as in Comparative Example 23. The gel film, with its end portions fastened on a pin frame, was heated at 350° C., 400° C., 450° C., and 500° C. for 30 seconds at each temperature, so as to produce a polyimide film with a thickness of 25 μm. Table 8 shows properties of the polyimide film.

Comparative Example 25

Polyamic acid was synthesized from a 3:1:3:1 mole ratio of p-phenylene bis(trimellitic acid monoester anhydride), pyromellitic dianhydride, 4,4'-diaminodiphenylether, and p-phenylenediamine. 100 g of a 18.5 wt % N,N-dimethyl-formamide solution of the polyamic acid was mixed and stirred with 35 g of acetic anhydride and 3.5 g of β-picoline. After defoamed by centrifugation, the mixture was cast on an aluminum foil to form a resin film of 400 μm. The mixture was stirred and defoamed while cooling to 0° C. The resin film was then heated at 90° C. for 120 seconds and detached from the aluminum foil to obtain a self-supporting gel film. The content of remaining volatile component and percent imidization of the gel film were 140% and 80%, respectively. Thereafter, the gel film, with its end portions fastened on a pin frame, was heated at 180° C., 370° C., and 520° C. for 45 seconds at each temperature, so as to produce a polyimide film with a thickness of 25 μm. Table 8 shows properties of the polyimide film.

Comparative Example 26

Polyamic acid was synthesized from a 3:1:3:1 mole ratio of p-phenylene bis(trimellitic acid monoester anhydride), pyromellitic dianhydride, 4,4'-diaminodiphenylether, and p-phenylenediamine. 100 g of a 18.5 wt % N,N-dimethyl-formamide solution of the polyamic acid was mixed and stirred with 35 g of acetic anhydride and 4.2 g of β-picoline. After defoamed by centrifugation, the mixture was cast on an aluminum foil to form a resin film of 400 μm. The mixture was stirred and defoamed while cooling to 0° C. The resin film was then heated at 90° C. for 120 seconds and detached from the aluminum foil to obtain a self-supporting gel film. The content of remaining volatile component and percent imidization of the gel film were 33% and 95%, respectively. Thereafter, the gel film, with its end portions fastened on a pin frame, was heated at 350° C., 450° C., and 520° C. for 45 seconds at each temperature, so as to produce a polyimide film with a thickness of 25 μm. Table 8 shows properties of the polyimide film.

Example 22

A gel film with a content of remaining volatile component 140% and percent imidization 80% was obtained in the exactly the same manner as in Comparative Example 25. The gel film, with its end portions fastened on a pin frame, was heated at 350° C., 400° C., 450° C., and 520° C. for 45 seconds at each temperature, so as to produce a polyimide film with a thickness of 25 μm. Table 8 shows properties of the polyimide film.

TABLE 8

|  | COMPARATIVE EXAMPLE 23 | COMPARATIVE EXAMPLE 24 | EXAMPLE 21 | COMPARATIVE EXAMPLE 25 | COMPARATIVE EXAMPLE 26 | EXAMPLE 22 |
|---|---|---|---|---|---|---|
| CONTENT OF REMAINING VOLATILE COMPONENT (%) | 160 | 35 | 160 | 140 | 33 | 140 |
| INITIAL TEMPERATURE OF HEATING (° C.) | 150 | 350 | 350 | 180 | 350 | 350 |
| BIREFRINGENCE (Δn) | 0.12 | 0.13 | 0.15 | 0.13 | 0.13 | 0.16 |
| MODULUS (GPa) | 4.0 | 4.1 | 4.5 | 4.6 | 4.9 | 5.4 |
| TENSILE STRENGTH (MPa) | 270 | 277 | 328 | 300 | 304 | 319 |
| COEFFICIENT OF THERMAL EXPANSION (ppm) | 16.8 | 15.9 | 14.0 | 15.0 | 14.5 | 13.3 |

With the present invention, a polyimide film with high modulus and low coefficient of thermal expansion can be provided both inexpensively and stably by a process not found conventionally, without increasing the number of monomer components, or without introducing expensive rigid monomers or a complex stretching device. The present invention can be suitably put to applications where precise dimension accuracy is required, such as in flexible printed circuit boards, TAB carrier tapes, or cover lay films for flexible printed circuit boards.

A process for producing a polyimide film according to the present invention may be adapted to include the steps of: casting or coating and subsequently drying an organic solvent solution of polyamic acid on a support, so as to produce a partially cured and/or partially dried polyamic acid film; dipping the polyamic acid film in tertiary amine or in a solution of tertiary amine, or applying tertiary amine or a solution of tertiary amine onto the polyamic acid film; and drying the film while imidizing the polyamic acid to polyimide.

A process for producing a polyimide film according to the present invention may include the step of removing waste droplets from a surface of the film.

A process for producing a polyimide film according to the present invention may be adapted so that the partially cured and/or partially dried polyamic acid film contains not more than 5 wt % to 100 wt % of remaining volatile component and has not less than 50% percent imidization.

In a process for producing a polyimide film according to the present invention, the tertiary amine may be selected from the group consisting of quinoline, isoquinoline, β-picoline, and pyridine.

A polyimide film according to the present invention may be produced by any of the foregoing processes.

Further, in order to achieve the foregoing objects, another process for producing a polyimide film may be adapted to include the steps of: mixing a chemical converting agent and a catalyst in a polyamic acid organic solvent solution and casting the resulting polyamic acid composition on a support; heating the polyamic acid composition on the support at temperatures of at least two levels; detaching the polyamic acid film from the support so as to obtain a partially cured and/or partially dried polyamic acid film; and imidizing remaining amic acid in the polyamic acid film and drying the film.

A polyimide film according to the present invention may be produced by the foregoing process.

A polyimide film according to the present invention may be produced by the steps of: mixing a chemical converting agent and a catalyst in a polyamic acid organic solvent solution and casting the resulting polyamic acid composition on a support; heating the polyamic acid composition on the support at temperatures of at least two levels; detaching the polyamic acid film from the support so as to obtain a partially cured and/or partially dried polyamic acid film; and imidizing remaining amic acid in the polyamic acid film and drying the film, wherein percent loss on heating of the polyimide film is 0.2 wt % to 2.5 wt %, of which a 0.01 wt % or greater portion with respect to a total weight of the film is from the catalyst.

Further, in order to achieve the foregoing objects, another process for producing a polyimide film according to the present invention may be adapted to include the steps of: mixing a chemical converting agent and a catalyst in a polyamic acid organic solvent solution and casting and heating the mixture on a support; detaching the mixture from the support with a remaining volatile component, so as to obtain a partially cured and/or partially dried polyamic acid film in which not less than 50 parts by weight is the catalyst, not more than 30 parts by weight is the solvent, and not more than 20 parts by weight is the chemical converting agent and/or a component derived from the chemical converting agent, with respect to 100 parts by weight of the remaining volatile component; and imidizing remaining amic acid and drying the film.

A process for producing a polyamic acid according to the present invention may be adapted so that the content of remaining volatile component of the partially cured and/or partially dried polyamic acid film is not more than 100 wt % when a weight of the polyamic acid film after 450° C. heating for 20 minutes is used as a reference.

A process for producing a polyimide film according to the present invention may be adapted so that the catalyst is a tertiary amine.

A polyimide film according to the present invention may be produced by the foregoing process.

A polyimide film according to the present invention has percent weight loss by heating of 0.2 wt % to 2.5 wt %, which is determined from $$(\text{percent weight loss by heating}) = (X-Y)/Y,$$

where X is a film mass after 150° C. heating for 10 minutes and Y is a film mass after 450° C. heating for 20 minutes, the percent weight loss by heating containing a 0.01 wt % or greater portion from a catalyst with respect to a total weight of the film.

Further, in order to achieve the foregoing objects, a process for producing a polyimide film according to the present invention, which produces the polyimide film by deposition of a polyamic acid containing composition by casting and/or coating, may be adapted to include the step of adding, to an organic solvent solution of the polyamic acid, a curing agent that contains a 1:0.15 to 1:0.75 mole ratio of not less than 1 mole equivalent of a dehydrating agent with respect to the amic acid and not less than 0.2 mole equivalent of an imidizing catalyst with respect to the amic acid.

Further, a process for producing a polyimide film according to the present invention, in the foregoing producing process of the polyimide film, may be adapted so that 30 to 70 parts of the curing agent is added to an organic solvent solution of 100 parts polyamic acid.

Further, a process for producing a polyimide film according to the present invention, in the foregoing producing process of the polyimide film, may be adapted so that a resin solution composition, which is prepared by adding the curing agent in the organic solvent solution of the polyamic acid, has a viscosity of 600 poise at 0° C.

Further, a process for producing a polyimide film according to the present invention, in the foregoing producing process of the polyimide film, may be adapted so that a resin solution composition, which is prepared by adding the curing agent in the organic solvent solution of the polyamic acid, has a viscosity of 400 poise at 0° C.

A process for producing a polyimide film according to the present invention may be adapted so that the imidizing catalyst is a tertiary amine.

The producing process of a polyimide film according to the present invention produces the polyimide film that is produced by the foregoing process.

Further, in order to achieve the foregoing objects, a polyimide film according to the present invention may be adapted so that a width during production is 1 m or greater, a ratio of maximum value to minimum value of tear propagation strength measured across the entire width is 0.7 or greater, and an R value of measured tear propagation strength of 0.6 g.

A process for producing a polyimide film according to the present invention may be adapted to deposit the film by casting a resin solution which is prepared by adding to an organic solvent solution of polyamic acid a curing agent containing not less than 1.0 to 3.0 mole equivalent of a dehydrating agent with respect to amic acid and not less than 0.3 mole equivalent of an imidizing catalyst with respect to the amic acid.

Further, a process for producing a polyimide film according to the present invention may be adapted so that the imidizing catalyst is a tertiary amine.

The present invention also provides a novel polyimide film and novel producing processes of the following configurations.

1) A polyimide film having a film width of 1250 mm or greater, a molecular orientation MOR-c of not more than 1.30 at any point of the film, and a tensile modulus of not less than 2.5 GPa and not more than 5.0 GPa.

2) A process for producing a polyimide film, which includes the steps of: casting a polyamic acid mixture solution of polyamic acid, dehydrating agent, ring-closure catalyst, and organic solvent on a support so as to obtain a film ("gel film" hereinafter) that is partially cured and/or partially dried to be self-supporting; and passing the gel film through a heating furnace with both ends of the gel film fastened, wherein (1) the polyamic acid mixture solution is mixed with 1.0 to 5.0 equivalent of a dehydrating agent with respect to an amic acid unit and 0.2 to 2.0 equivalent of a ring-closure catalyst with respect to the amic acid unit, and (2) an initial temperature of heating in the heating furnace is controlled to be no more than +100° C. of a temperature of the support and within 150° C. to 250° C.

3) A process of producing a polyimide film as defined in 2), wherein the gel film contains the remaining volatile component in a range of 15% to 150%.

4) A process of producing a polyimide film as defined in 2) or 3), wherein the polyamic acid is obtained by polycondensation of monomers which contain a diamine component and an acid dianhydride as a raw material, and the diamine component contains not less than 20 mole % of paraphenylenediamine with respect to the total diamine component.

Further, a process for producing a polyimide film according to the present invention may be adapted to include the steps of: casting a polyamic acid mixture solution of polyamic acid, dehydrating agent, ring-closure catalyst, and organic solvent on a support so as to obtain a film ("gel film" hereinafter) that is partially cured and/or partially dried to be self-supporting; and heating the gel film by tenter heating in which a heat treatment is carried out on the gel film with fastened both ends, wherein a content of remaining volatile component of the gel film and an initial temperature of heating in the tenter heating are controlled to control modulus and coefficient of thermal expansion.

Further, a process for producing a polyimide film according to the present invention may be adapted to include the steps of: casting a polyamic acid mixture solution of polyamic acid, dehydrating agent, ring-closure catalyst, and organic solvent on a support so as to obtain a film ("gel film" hereinafter) that is partially cured and/or partially dried to be self-supporting; and heating the gel film by tenter heating in which heat treatment is carried out on the gel film with fastened both ends, wherein a content of remaining volatile component of the gel film and an initial temperature of heating in the tenter heating are controlled to increase modulus within a range of 1.0 GPa or to lower coefficient of thermal expansion within a range of 4 ppm.

Further, the producing process of the polyimide film may be adapted so that the content of remaining volatile component of the gel film is set within 50 wt % to 300 wt %, and the initial temperature in the tenter heating step is set within 200° C. to 400° C.

Further, the producing process of the polyimide film may be adapted so that the initial temperature of the tenter heating is set within 250° C. to 400° C. when the content of remaining volatile component of the gel film is 50 wt % to 150 wt %, or within 200° C. to 350° C. when the content of remaining volatile component of the gel film is 150 wt % to 300 wt %.

Further, the producing process of the polyamic acid may be adapted so that the polyamic acid, which is the precursor of the polyimide, is obtained by polycondensation of monomers which mainly contain aromatic tetracarboxylic dianhydride and aromatic diamine as a raw material, and the proportion of paraphenylene contained is not less than 20 mole % and not more than 65 mole % with respect to the total aromatic diamine component.

A polyimide film according to the present invention may be produced by the foregoing producing process of the polyimide film to have a birefringence of not less than 0.15.

The invention being thus described by way of specific embodiments and examples in the foregoing best mode for carrying out the invention section, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The present invention relates to polyimide films with high mechanical strengths and producing processes of such polyimide films. The invention is applicable, for example, in the fields of electronic and electrical component materials of computers and IC controls.

The invention claimed is:

1. A process for producing a polyimide film, comprising the steps of
   casting and/or coating and subsequently drying an organic solvent solution of polyamic acid on a support, so as to produce a gel film, which is a partially cured and/or partially dried polyamic acid film; and
   imidizing the gel film to obtain the polyimide film,
   said process producing the gel film by carrying out the step of imidizing the gel film to obtain the polyimide film by tenter heating in which a heat treatment is carried out on the gel film with fastened both ends, wherein a content of remaining volatile component of the gel film is set within 50 wt % to 300 wt %, and an initial temperature of heating in the tenter heating is set within 200° C. to 400° C., to control modulus and coefficient of thermal expansion.

2. The process as set forth in claim 1, wherein the initial temperature of the tenter heating is set within 250° C. to 400° C. when the content of remaining volatile component of the gel film is 50 wt % to 150 wt %.

3. The process as set forth in claim 1, wherein the initial temperature of the tenter heating is set within 200° C. to 350° C. when the content of remaining volatile component of the gel film is 150 wt % to 300 wt %.

4. The process as set forth in claim 3, wherein the polyamic acid is obtained from polycondensation of monomers which contain mainly aromatic tetracarboxylic dianhydride and aromatic diamine as a raw material, and wherein not less than 20 mole % to not less than 65 mole % of paraphenylenediamine with respect to a total aromatic diamine component is used.

5. A polyimide film, produced by the process of claim 4, with a birefringence of 0.15 or greater.

6. A process for producing a polyimide film with a birefringence of 0.15 or greater, comprising the steps of
casting and/or coating and subsequently drying an organic solvent solution of polyamic acid on a support, so as to produce a gel film, which is a partially cured and/or partially dried polyamic acid film, wherein the polyamic acid is obtained from polycondensation of monomers which contain mainly aromatic tetracarboxylic dianhydride and aromatic diamine as a raw material, in which not less than 20 mole % to not less than 65 mole % of paraphenylenediamine with respect to a total aromatic diamine component is used; and
imidizing the gel film to obtain the polyimide film,
said process producing the gel film by carrying out the step of imidizing the gel film to obtain the polyimide film by tenter heating in which a heat treatment is carried out on the gel film with fastened both ends, wherein a content of remaining volatile component of the gel film is set within 150 wt % to 300 wt %, and an initial temperature of heating in the tenter heating is set within 200° C. to 350° C.

* * * * *

Disclaimer

9,441,082 B2 - Hisayasu Kaneshiro, Kyoto (JP); Toshihisa Itoh, Shiga (JP); Kiyokazu Akahori, Shiga (JP). POLYIMIDE FILM AND PROCESS FOR PRODUCING THE SAME. Patent dated September 13, 2016. Disclaimer filed March 7, 2018, by the assignee Kaneka Corporation.

I hereby disclaim the following complete claim 6 of said patent.

*(Official Gazette, September 6, 2022)*